(12) United States Patent
Bao et al.

(10) Patent No.: US 11,903,244 B2
(45) Date of Patent: Feb. 13, 2024

(54) DISPLAY PANEL, DISPLAY APPARATUS, AND METHOD OF FABRICATING DISPLAY PANEL

(71) Applicants: Chengdu BOE Optoelectronics Technology Co., Ltd., Sichuan (CN); BOE Technology Group Co., Ltd., Beijing (CN)

(72) Inventors: Jiandong Bao, Beijing (CN); Weifeng Zhou, Beijing (CN); Liqiang Chen, Beijing (CN); Paoming Tsai, Beijing (CN); Shuang Du, Beijing (CN); Zhao Li, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 431 days.

(21) Appl. No.: 17/289,725

(22) PCT Filed: Jul. 27, 2020

(86) PCT No.: PCT/CN2020/104823
§ 371 (c)(1),
(2) Date: Apr. 29, 2021

(87) PCT Pub. No.: WO2022/020992
PCT Pub. Date: Feb. 3, 2022

(65) Prior Publication Data
US 2022/0310978 A1    Sep. 29, 2022

(51) Int. Cl.
*H10K 59/80*    (2023.01)
*H10K 50/86*    (2023.01)
(Continued)

(52) U.S. Cl.
CPC ......... *H10K 50/865* (2023.02); *G06F 3/0446* (2019.05); *H10K 50/844* (2023.02);
(Continued)

(58) Field of Classification Search
CPC ..................... H10K 50/865; H10K 59/8792
See application file for complete search history.

(56) References Cited

U.S. PATENT DOCUMENTS

| 2013/0083263 A1 | 4/2013 | Kim et al. |
| 2014/0217431 A1 | 8/2014 | Aoyagi et al. |

(Continued)

FOREIGN PATENT DOCUMENTS

| CN | 103972265 A | 8/2014 |
| CN | 106206652 A | 12/2016 |

(Continued)

OTHER PUBLICATIONS

International Search Report & Written Opinion dated Apr. 25, 2021, regarding PCT/CN2020/104823.

*Primary Examiner* — Daniel P Shook
(74) *Attorney, Agent, or Firm* — Intellectual Valley Law, P.C.

(57) ABSTRACT

A display panel having a plurality of subpixels is provided. The display panel includes a black matrix layer; a black adhesive layer on the black matrix layer; and a cover an a side of the black adhesive layer away from the black matrix layer. The black adhesive layer extends substantially throughout an entirety of a display region of the display panel, including a subpixel region and an inter-subpixel region. The black adhesive layer includes an optically clear adhesive and particles distributed throughout the optically clear adhesive. Light transmittance of the black adhesive layer is in a range of 40% to 80%.

20 Claims, 18 Drawing Sheets

(51) Int. Cl.
  *G06F 3/044* (2006.01)
  *H10K 50/844* (2023.01)
  *H10K 59/38* (2023.01)
  *H10K 59/40* (2023.01)
  *H10K 59/122* (2023.01)
  *H10K 71/00* (2023.01)

(52) U.S. Cl.
  CPC ........... *H10K 59/122* (2023.02); *H10K 59/38* (2023.02); *H10K 59/40* (2023.02); *H10K 59/8792* (2023.02); *H10K 71/00* (2023.02); *G06F 2203/04111* (2013.01); *G06F 2203/04112* (2013.01)

(56) References Cited

U.S. PATENT DOCUMENTS

| | | | |
|---|---|---|---|
| 2016/0351631 A1 | 12/2016 | Lee | |
| 2018/0188590 A1 | 7/2018 | Gu et al. | |
| 2023/0287008 A1* | 9/2023 | Moon | C07F 15/045 524/102 |

FOREIGN PATENT DOCUMENTS

| | | | |
|---|---|---|---|
| CN | 106681042 A | 5/2017 | |
| CN | 108445669 A | 8/2018 | |
| CN | 110196502 A | 9/2019 | |

\* cited by examiner

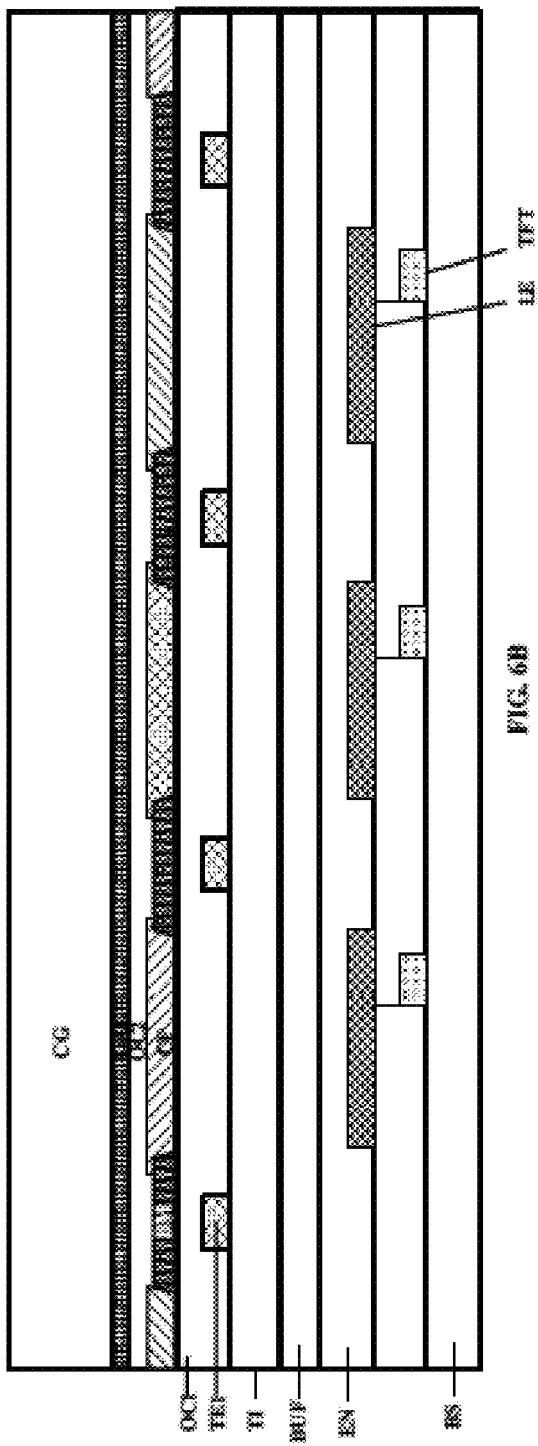
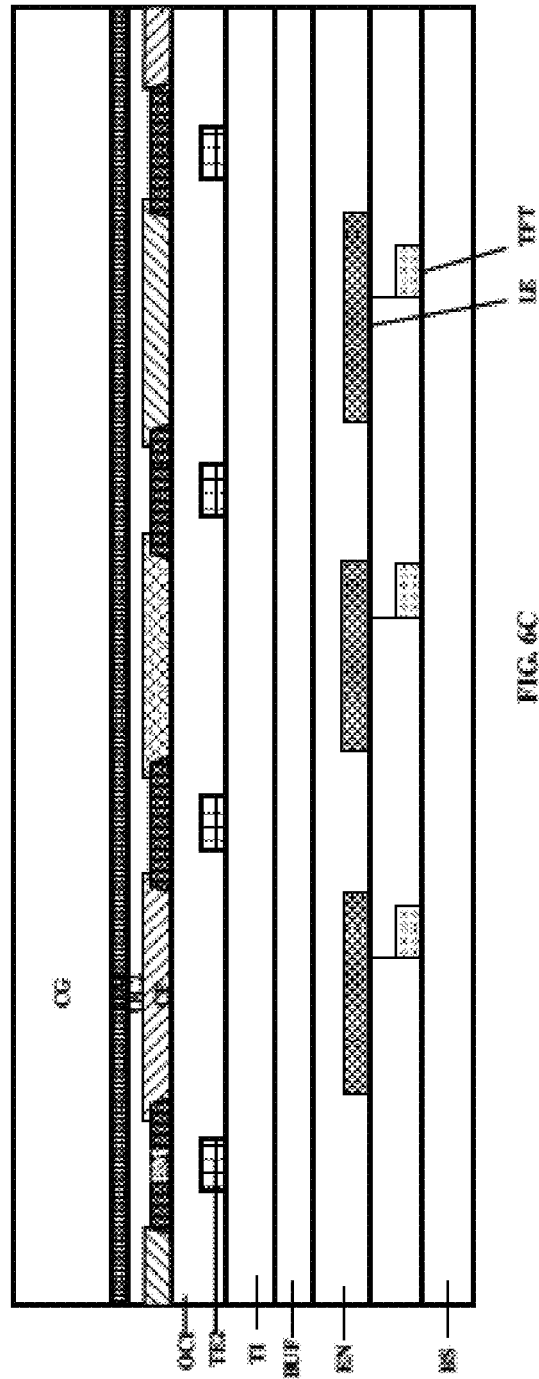
FIG. 6B
FIG. 6C

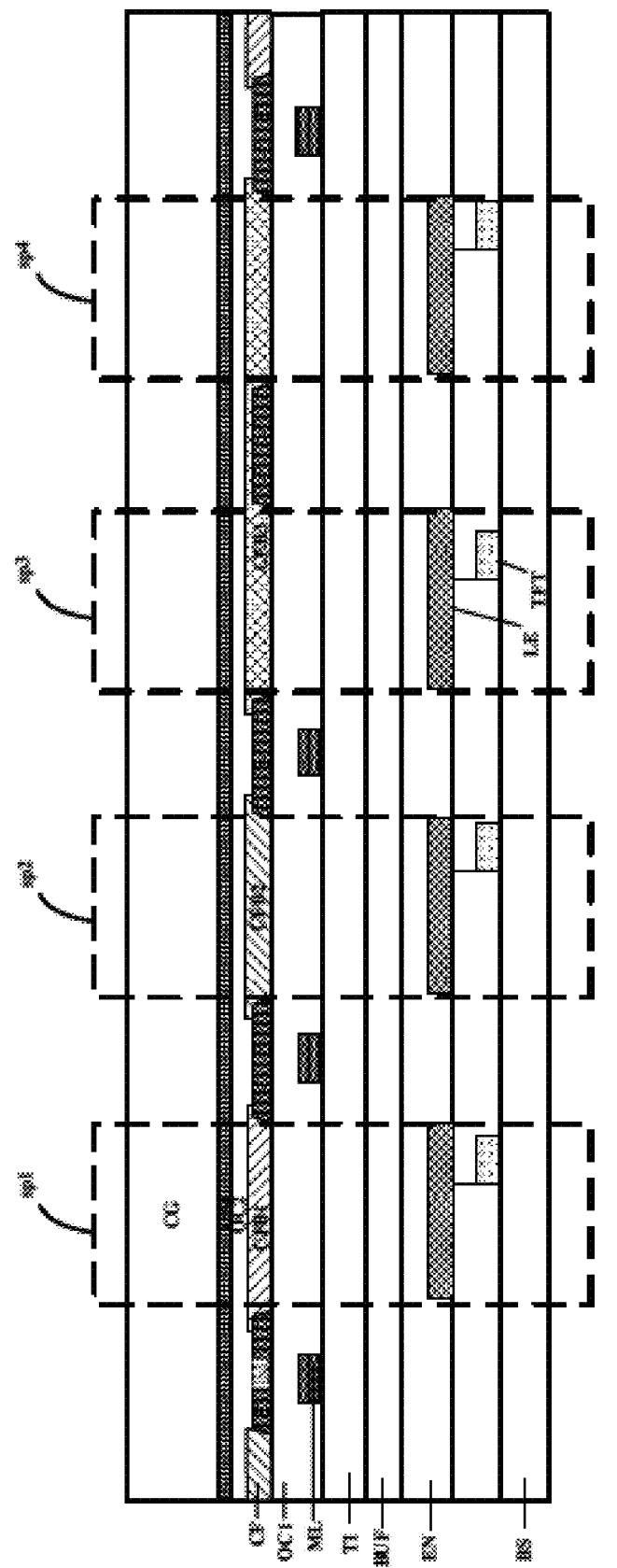

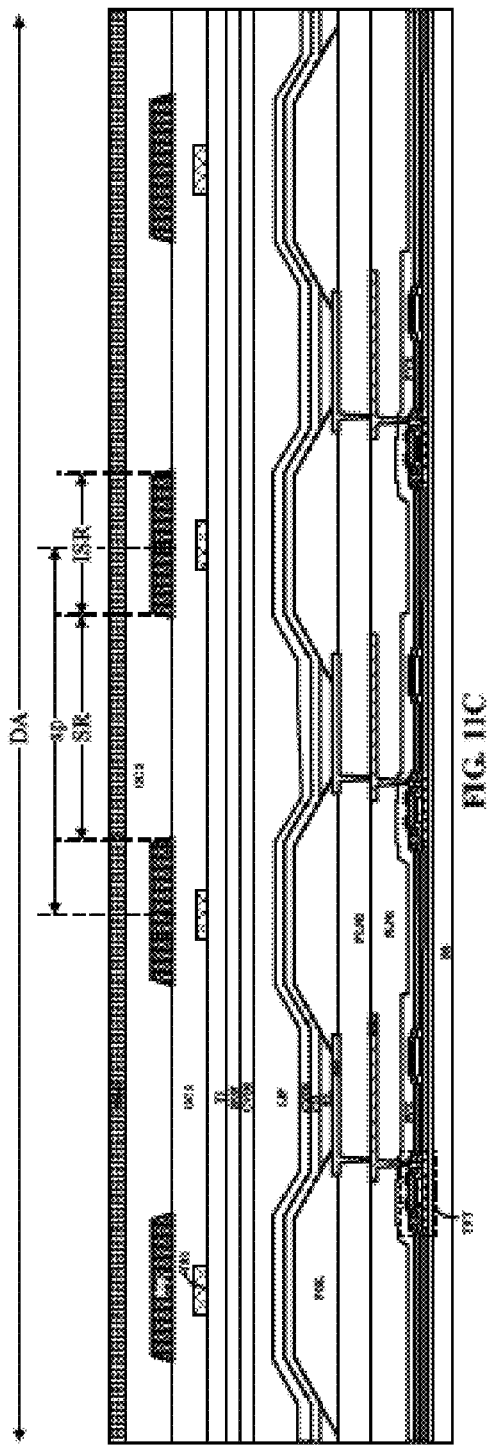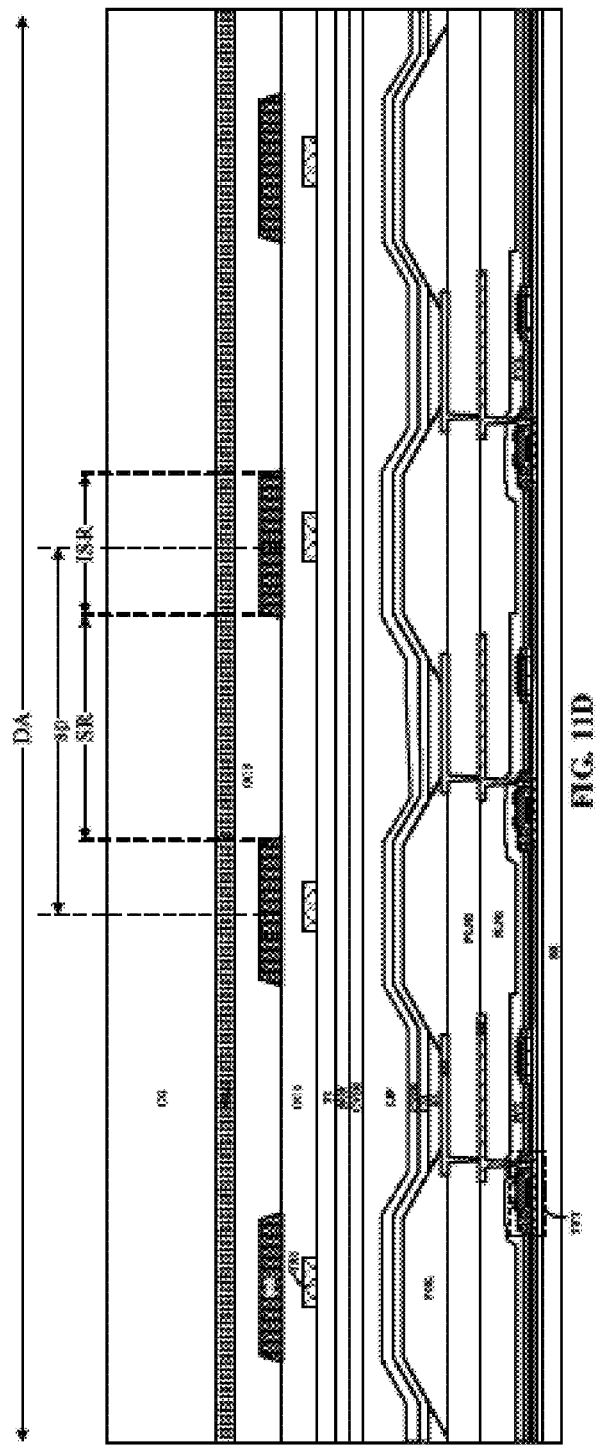

DISPLAY PANEL, DISPLAY APPARATUS, AND METHOD OF FABRICATING DISPLAY PANEL

CROSS-REFERENCE TO RELATED APPLICATION

This application is a national stage application under 35 U.S.C. § 371 of International Application No. PCT/CN2020/104823, filed Jul. 27, 2020, the contents of which are incorporated by reference in the entirety.

TECHNICAL FIELD

The present invention relates to display technology, move particularly, to a display panel, a display apparatus, and a method of fabricating a display panel.

BACKGROUND

A flexible display apparatus is a bendable or deformable display apparatus having a flexible display panel. Examples of flexible display apparatuses include a flexible organic light emitting diode (OLED) display apparatus, a flexible electrophoretic display (EPD) apparatus, and a flexible liquid crystal display (LCD) apparatus. As a new generation display apparatus, the flexible display apparatus is thinner and lighter, having high contrast, high responsiveness, and high brightness. It also provides full color and a wide viewing angle. The flexible display apparatus has found a wide range of applications in mobiles phones, personal digital assistance (PDAs), digital cameras, on-board displays, notebook computers, on-wall televisions, as well as various military applications. A flexible display apparatus includes a flexible array substrate. A base substrate of the flexible array substrate can be made of flexible material such as plastic.

SUMMARY

In one aspect, the present disclosure provides a display panel, comprising a plurality of subpixels; wherein the display panel comprises a black matrix layer; a black adhesive layer on the black matrix layer; and a cover on a side of the black adhesive layer away from the black matrix layer; wherein the black adhesive, layer exceeds substantially throughout an entirety of a display region of the display panel, including a subpixel region and an inter-subpixel region; the black adhesive layer comprises an optically clear adhesive and particles distributed throughout the optically clear adhesive; and light transmittance of the black adhesive layer is in a range of 40% to 80%.

Optionally, the light transmittance of the black adhesive layer is in a range of 48% to 71%.

Optionally, the display panel is absent of any polarizer.

Optionally, the display panel further comprises a base substrate; a plurality of thin film transistors on the base substrate; a first planarization layer on side of the plurality of thin film transistors away from the base substrate; an anode on a side of the first planarization layer away from the base substrate; a pixel definition layer on a side of the anode away from the base substrate, wherein an orthographic projection of the pixel definition layer on the base substrate covers an orthographic projection of the black matrix layer on the base substrate; a light emitting layer on a side of the anode array from the first planarization layer; a cathode on a side of the light emitting layer away from the anode; a first inorganic encapsulating layer on a side of the cathode away from light emitting layer; an organic encapsulating layer on a side of the first inorganic encapsulating layer away from the cathode; and a second inorganic encapsulating layer on a side of the organic encapsulating layer away from the first inorganic encapsulating layer.

Optionally, the display panel further comprises a passivation layer on a side of the plurality of thin film transistors away from the base substrate; a relay electrode an side of the first planarization layer away from the passivation layer; and a second planarization layer on a side of the relay electrode away from the first planarization layer.

Optionally, the display panel further comprises a first overcoat layer; and a second overcoat layer; wherein the first overcoat layer is on a side of the black matrix layer away from the black adhesive layer; the second overcoat layer is on a side of the black adhesive layer closer to the black matrix layer; and the black adhesive layer adheres the cover to the second overcoat layer.

Optionally, the display panel is absent of my color filter; and in the subpixel region, the second overcoat layer is in direct contact with the first overcoat layer.

Optionally, the display panel further compress a color filter on the black matrix layer and extending into apertures defined by the black matrix layer; an orthographic projection of the color filter on the base substrate covers an orthographic projection of the light emitting layer on the base substrate; and the orthographic projection of the black adhesive layer on the first overcoat layer further covers an orthographic projection of the color filter on the first overcoat layer.

Optionally, the orthographic projection of the color filter on the base substrate covers an orthographic projection of the apertures defined by the black matrix layer on the base substrate.

Optionally, the color filter is between the first overcoat layer and the second overcoat layer; the color filter is in direct contact with the first overcoat layer, and in direct contact with the second overcoat layer; and the black matrix layer is in direct contact with the first overcoat layer, and in direct contact with the second overcoat layer.

Optionally, the display panel further comprises a buffer layer; a plurality of touch electrode bridges on the buffer layer; a touch insulating layer on a side of the plurality of touch electrode bridges away from the buffer layer, and a plurality of first touch electrodes and a plurality of second touch electrodes on a side of the touch insulating layer away from the buffer layer, electrode blocks of a respective one of the plurality of second touch electrodes electrically connected by the plurality of touch electrode bridges, adjacent electrode blocks of the respective one of the plurality of second touch electrodes respectively extending through the touch insulating layer to correct to a respective one of the plurality of touch electrode bridges; wherein the first overcoat layer is on a side of the plurality of first touch electrodes and the plurality of second touch electrodes away from the touch insulating layer.

Optionally, the plurality of first touch electrodes and the plurality of second touch electrodes are mesh electrodes comprising mesh lines; a respective mesh of the mesh electrodes surrounds at least one subpixel; and an orthographic projection of the black matrix layer on the base substrate coves an orthographic projection of the mesh lines on the base substrate.

Optionally, the plurality of subpixels comprises a first subpixel of a first color, a second subpixel of a second color, a third subpixel of a third color, and a fourth subpixel of the third color, a first respective mesh of the mesh electrodes surrounds the first subpixel; a second respective mesh of the mesh electrodes surrounds the second subpixel; and a third respective mesh of the mesh electrodes surrounds both the third subpixel and the fourth subpixel.

Optionally, the color filter comprises a first color filter block of the first color, a second color filter block of the second color, and a third color filter block of the third color, and a fourth color filter block of the third color; the first respective mesh of the mesh electrodes surrounds a first region having the first color filter block; the second respective mesh of the mesh electrodes surrounds a second region having the second color filter block and the third respective mesh of the mesh electrodes surrounds a third region having both the third color filter block and the fourth color filter block.

Optionally, the black adhesive layer has a thickness in a range of 10 μm to 100 μm.

Optionally, the particles have an average diameter in a range of 10 nm to 500 nm.

Optionally, the particles comprise a light absorbing black material.

Optionally, the black material comprises carbon or a black metal oxide material.

In another aspect, the present disclosure provides a display apparatus, comprising the display panel described herein or fabricated by a method described herein, and an integrated circuit connected to the display panel.

In another aspect, the present disclosure provides a method of fabricating a display panel having a plurality of subpixels, composing forming a black matrix layer; forming a black adhesive layer on the black matrix layer; and forming a cover on a side of the black adhesive layer away from the black matrix layer; wherein the black adhesive layer is formed to extend substantially throughout an entirety of display region of the display panel, including a subpixel region and an inter-subpixel region; the black adhesive layer comprises an optically clear adhesive and particles distributed throughout the optically clear adhesive; and light transmittance of the black adhesive layer is in a range of 40% to 80%.

BRIEF DESCRIPTION OF THE FIGURES

The following drawings are merely examples for illustrative purposes accord to various disclosed embodiments and are not intended to limit the scope of the present invention.

FIG. 6B is a cross-sectional view along an A-A' line in FIG. 6A.

FIG. 6C is a cross-sectional view along a B-B' line in FIG. 6A.

FIG. 7C is a cross-sectional view along a C-C' line in FIG. 7A.

FIGS. 11A to 11D illustrate a method of fabricating a display panel is some embodiments according to the present disclosure.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, a display panel, a display apparatus, and a method of fabricating a display panel that substantially obviate one or more of the problems due to limitations and disadvantages of the related art. In one aspect, the present disclosure provides a display panel. In some embodiments, the display panel includes a plurality of subpixels. The display panel includes a black matrix layer; a black adhesive layer on the black matrix layer; and a cover on a side of the black adhesive layer away from the black matrix layer. Optionally, the black adhesive layer extends substantially throughout an entirety of a display region of the display panel, including the subpixel region and an inter-subpixel region. Optionally, the black adhesive layer comprises an optically clear adhesive and opaque particles disbanded throughout the optically clear adhesive. Optionally, light transmittance of the black adhesive layer is in a range of to 40% to 80%.

In some embodiments, the display panel includes a first overcoat layer; a black matrix layer on the first overcoat layer, defining a subpixel region; a second overcoat layer on a side of the black matric layer away from the first overcoat layer; an black adhesive layer on a side of the second overcoat layer away from the black matrix layer; and a cover glass on a side of the black adhesive layer away from the second overcoat layer. Optionally, the black adhesive layer extends substantially throughout an entirety of a display region of the display panel, including the subpixel region and an inter-subpixel region. Optionally, the black adhesive layer comprises an optically clear adhesive and opaque particles distributed throughout the optically clear adhesive. Optionally, the black adhesive layer adheres the cover glass to the second overcoat layer. Optionally, an orthographic projection of the black adhesive layer on the first overcoat layer covers an orthographic projection of the black matrix layer on the first overcoat layer.

Figure 1:
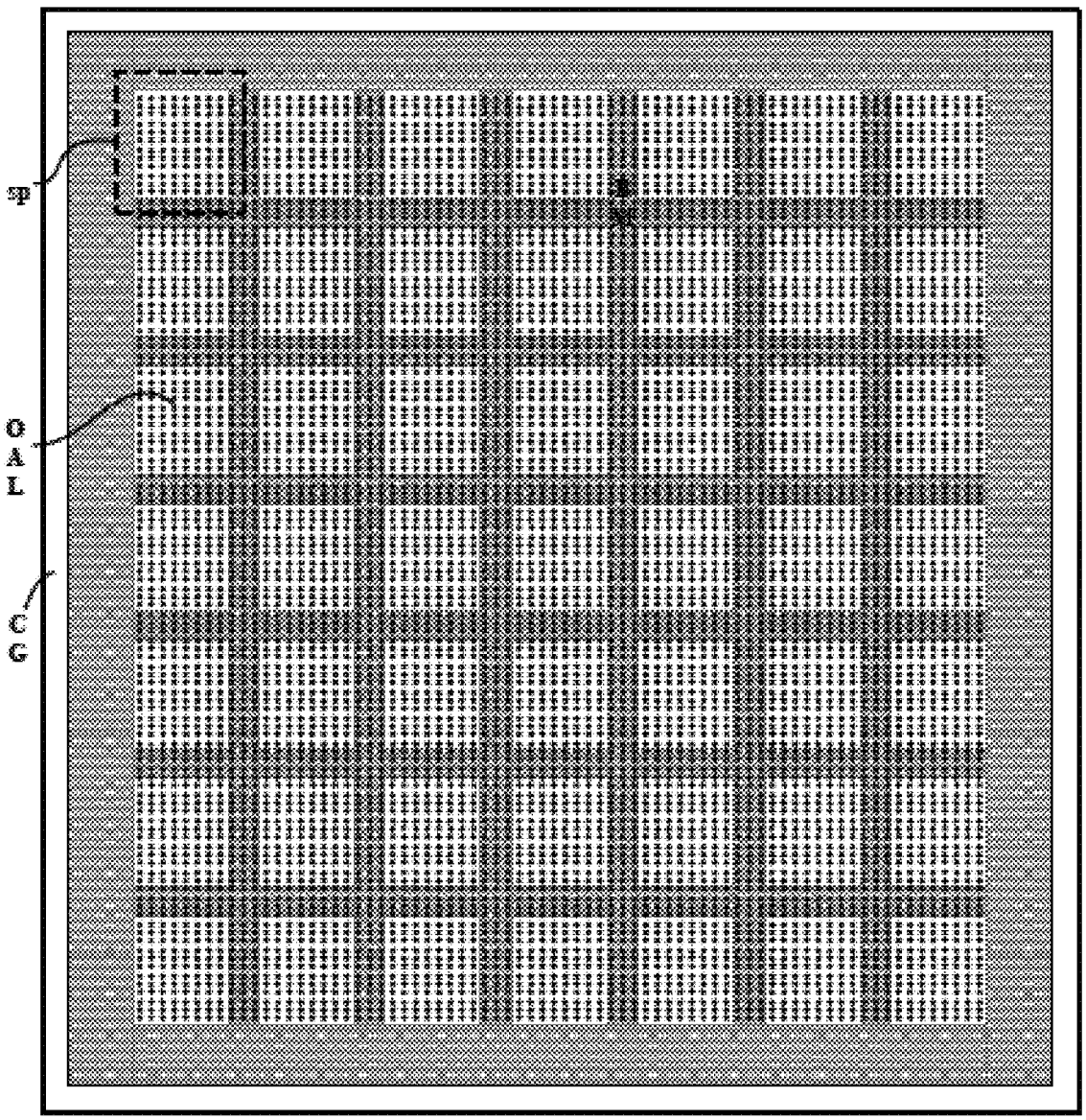
FIG. 1 is a plan view of a display panel is some embodiments according to the present disclosure.

FIG. 1 is a plan view of a display panel in some embodiments according to the present disclosure. Referring to FIG. 1, the display panel includes a plurality of subpixels sp. A cover CG covers other parts of the display panel, functioning as the external surface of the display panel, e.g., a touch surface of the display panel. Underneath the cover CG, the display panel includes an black adhesive layer OAL. As shown in FIG. 1, the black adhesive layer OAL extends throughout the display panel. The display panel further includes a black matrix layer BM underneath the black adhesive layer OAL.

Figure 2:
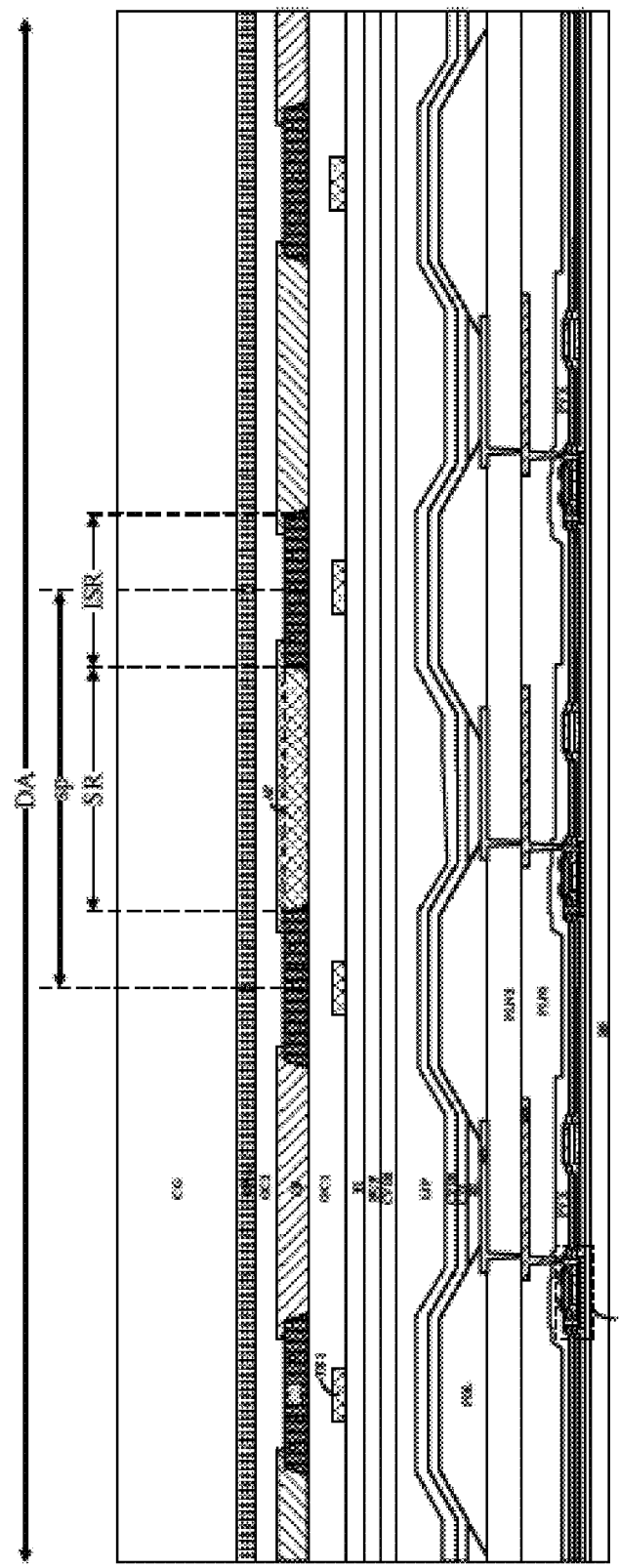
FIG. 2 is a cross-sectional view of a display region in a display panel in some embodiments according to the present disclosure.

FIG. 2 is a cross-sectional view of a display region in a display panel in some embodiments according to the present disclosure. A portion of a display region DA of the display panel is shown in FIG. 2. The display region DA includes a subpixel region SR and an inter-subpixel region ISR.

As used herein, the term "display region" refers to a region of the display panel where image is actually displayed. Optionally, the display region may include both a subpixel region and an inter-subpixel region. A subpixel region refers to a light emission region of a subpixel, such as a region corresponding to a pixel electrode in a liquid crystal display or a region corresponding to a light emissive layer in an organic light emitting display. An inter-subpixel region refers to a region between adjacent subpixel regions, such as a region corresponding to a black matrix in a liquid crystal display or a region corresponding a pixel definition layer in an organic light emitting display. Optionally, the inter-subpixel region is a region between adjacent subpixel regions in a same pixel. Optionally, the inter-pixel region is a region between two adjacent subpixel regions from two adjacent pixels.

As used herein, a subpixel region refers to a light emission region of a subpixel, such as a region corresponding to a pixel electrode in a liquid crystal display, a region corresponding to a light emissive layer in an organic light emitting diode display panel, or a region corresponding to the light transmission layer in the present disclosure. Optionally, a pixel may include a number of separate light emission regions corresponding to a number of subpixels in the pixel. Optionally, the subpixel region is a light emission region of a red color subpixel. Optionally, the subpixel region is a light emmission region of a green color subpixel. Optionally, the subpixel region is a light emission region of a blue color subpixel. Optionally, the subpixel region is a light emission region of a white color subpixel.

As used herein, an inter-subpixel region refers to a region between adjacent subpixel regions, such as a region corresponding to a black matrix in a liquid crystal display, a region corresponding a pixel definition layer in an organic light emitting diode display panel, or a black matrix in the present display panel. Optionally, the inter-subpixel is a region between adjacent subpixel regions in a same subpixel. Optionally, the inter-subpixel region is a region between two adjacent subpixel regions from two adjacent pixels. Optionally, the inter-subpixel region is a region between a subpixel region of a red color subpixel and a subpixel region of an adjacent green color subpixel. Optionally, the inter-subpixel region is a region between a subpixel region of a red color subpixel and a subpixel region of an adjacent blue color subpixel. Optionally, the inter-subpixel region is a region between a subpixel region of a green color subpixel and a subpixel region of an adjacent blue color subpixel.

In some embodiments, the display panel includes a first overcoat layer OC1; a black matrix layer BM on the first overcoat layer; a second overcoat layer OC2 on a side of the black matric layer BM away from the first overcoat layer OC1; as black adhesive layer OAL on a side of the second overcoat layer OC2 away from the black matrix layer BM; and a cover CG on a side of the black adhesive layer OAL away from the second overcoat layer OC2. As shown in FIG. 2, the black adhesive layer OAL extends substantially throughout an entirety of a display repot DA of the display panel, including the subpixel region SR and an inter-subpixel region ISR.

Figure 3:
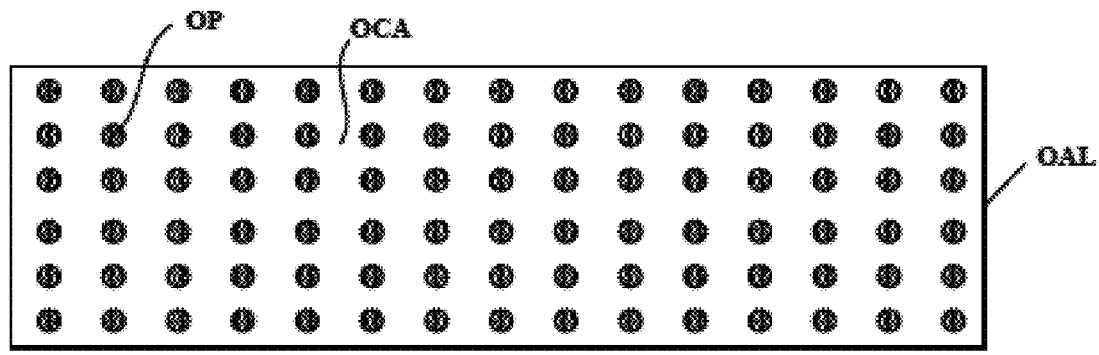
FIG. 3 is a schematic diagram illustrating the structure of an black adhesive layer in some embodiments according to the present disclosure.

FIG. 3 is a schematic diagram illustrating the structure of an black adhesive layer in some embodiments according to the present disclosure. Referring to FIG. 3, the black adhesive layer in some embodiments includes an optically clear adhesive OCA and opaque particles OP distributed throughout the optically clear adhesive OCA.

Various appropriate materials and various appropriate fabricating methods may be used to make the black adhesive layer OAL. Examples of appropriate optically clear adhesive materials include, but are not limited to, polyacrylic, e.g., polymethyl methacrylate (PMMA); cyclic olefin copolymer; polycarbonate; silicone-based, optically clear adhesive materials; or a combination thereof. Examples of appropriate opaque particle materials include light absorbing black materials such an inorganic black material and an organic black material. Examples of inorganic black materials include carbon add black metal oxide materials. Examples of organic black materials include chromium organic black materials, graphite, a pigment-containing resin.

In some embodiments, the black adhesive layer OAL adheres the cover CG to the second overcoat layer OCA2. An orthographic projection of the black adhesive layer OAL on the first overcoat layer OC1 covers an orthographic projection of the black matrix layer BM on the first overcoat layer OC1.

In some embodiments, the black adhesive layer OAL has a light transmittance in a range of 40% to 90%, e.g., 40% to 45%, 45% to 50%, 50% to 55%, 55% to 60%, 60% to 65%, 65% to 70%, 70% to 75%, 75% to 80%, or 80% to 90%. As used herein, the team "light transmittance" refers to a fraction of incident light that passes through an black adhesive layer OAL, at a specified wavelength, e.g., from 400 nm to 780 nm. Optionally, the black adhesive layer OAL has a light transmittance in a range of 48% to 71%.

Optionally, light transmittances of the black adhesive layer OAL respectively in the subpixel region SR and the inter-subpixel region ISR are substantially same. As used herein, the term "substantially same" refers to a difference between two values not exceeding 10% of a base value (e.g., one of the two values), e.g., not exceeding 8%, not exceeding 6%, not exceeding 4%, not exceeding 2%, not exceeding 1%, not exceeding 0.5%, not exceeding 0.1%, not exceeding 0.05%, and not exceeding 0.01%, of the base value. Optionally, the light transmittance of the black adhesive layer OAL is substantially uniform throughout the display region DA.

Optionally, the optically clear adhesive OCA (considered alone) has a light transmittance greater than 90%, e.g., greater than 92%, greater than 94%, greater than 96%, greater than 98%, or greater than 99%.

Optionally, the opaque particles OP typically have a light transmittance relatively very low, e.g., less than 50%, less than 60%, less than 70%, less than 80%, less than 90% or less than 95%.

Optionally, the opaque particles OP are substantially evenly distributed throughout an entirety of a display region of the display panel, including the subpixel region SR and an inter-subpixel region ISR. As used herein, the term "substantially evenly distributed" refers to that there are substantially same number of the opaque particles OP per unit area throughout the entirety of a display region of the display panel. For example, a number of the opaque particles OP per unit area in the subpixel region SR is substantially same as a number of the opaque particles OP per unit area in the inter-subpixel region ISR. In another example the term "substantially evenly distributed" refers to that there are substantially same number of the opaque particles OP per unit area throughout the entirety of a display region of the display panel, aid also that there are substantially same number of the opaque particles OP per unit volume throughout the entirety of a display region of the display panel. Optionally, the opaque particles OP are randomly and substantially evenly distributed throughout an entirety of a display region of the display panel, including the subpixel region SR and an inter-subpixel region ISR.

Figure 4:
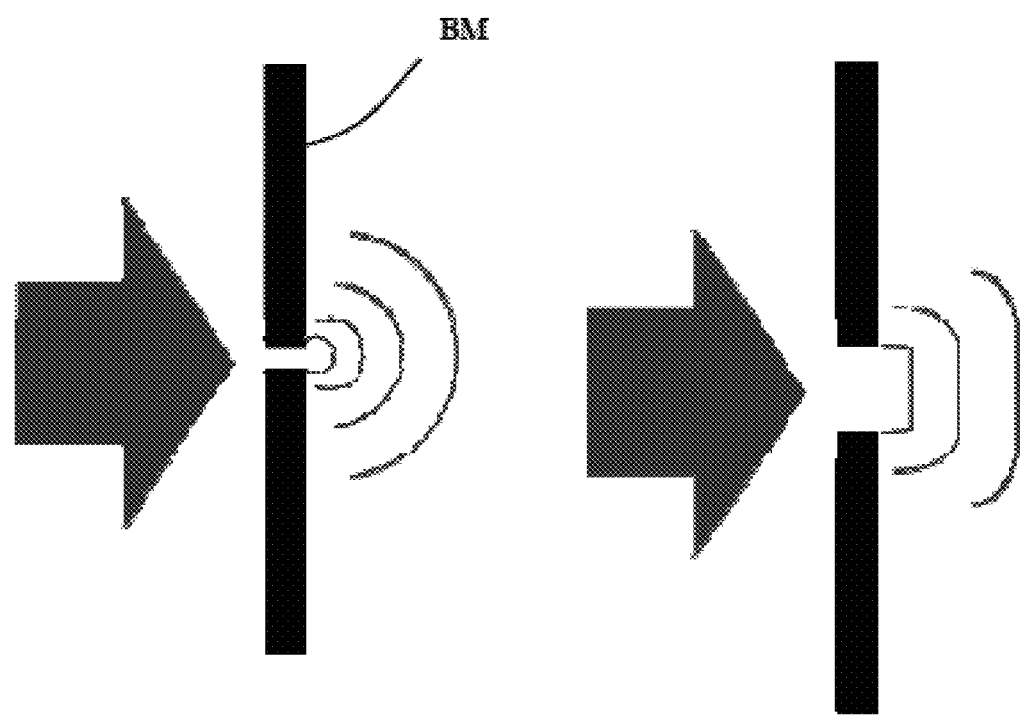
FIG. 4 illustrates aperture diffraction due to the presence of a black matrix layer.

In a display panel having components such as touch electrodes and thin film transistors and signal lines, light reflection of these metal components typically can be prevented by having a polarizer on the display panel. In a cover-film-on-encapsulation (COE) display panel, a black matrix is formed on the display panel. The presence of the black matrix layer results in aperture diffraction. FIG. 4 illustrates aperture diffraction due to the presence of a black matrix layer. Moreover, the aperture diffraction leads to color separation, severely affecting display quality.

Figure 5:
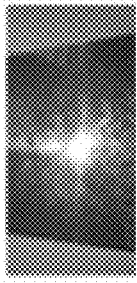
FIG. 5 shows unexpected results using the black adhesive layer OAL to eliminate color separation.

The inventors of the present disclosure discover, unexpectedly and surprisingly, that inclusion of an black adhesive layer OAL can effectively eliminate the color separation caused by the aperture diffraction. FIG. 5 shows unexpected results using the black adhesive layer OAL to eliminate color separation. As shown in FIG. 5, black adhesive layers having light transmittances respectively of 71%, 63%, and 50% are used. Color separation was dramatically reduced even with the black adhesive layer OAL having 71% light transmittance (a 73% reduction of color separation index from 20.7 to 5.6). As shown in FIG. 7, not only color separation can be significantly reduced (e.g., more than 70%, more than 80%, or more than 90%), the reflected light is more narrowly focused along a horizontal direction (e.g., uni-directional), as compared to the omni-directional reflected light observed in the control. In addition, a color spectrum of the reflected light in the display panels having the black adhesive layer OAL is moth narrower (e.g., uni-color) as compared to the multi-color reflected light observed in the control. Further, it is observed in the present disclosure that an extremely low haze level (e.g., lower than 10%, lower than 7.5%, or lower than 5%) can be achieved using the black adhesive layer OAL in the present display panel.

In some embodiments, the display panel is absent of any polarizer. Optionally, the display panel is absent of any polarizer.

The black adhesive layer OAL may have various appropriate thicknesses. Optionally, the black adhesive layer OAL has a thickness in a range of 10 μm to 100 μm, e.g., 10 μm to 20 μm, 20 μm to 30 μm, 30 μm to 40 μm, 40 μm to 50 μm, 50 μm to 60 μm, 60 μm to 70 μm, 70 μm to 80 μm, 80 μm to 90 μm, or 90 μm to 100 μm.

The opaque particles may have various appropriate sizes. Optionally, the opaque particles have an average diameter in a range of 10 nm to 500 nm, e.g., 10 nm to 50 nm, 50 nm to 100 nm, 100 nm to 150 nm, 150 nm to 200 nm, 200 nm to 250 nm, 250 nm to 300 nm, 300 nm to 350 nm, 350 nm to 400 nm, 400 nm to 450 nm, or 450 nm to 500 nm.

Referring to FIG. 2 again, the display panel in some embodiments further includes a buffer layer BUF; a plurality of touch electrode bridges TBR on the buffer layer BUF; a touch insulating layer TI on a side of the plurality of touch electrode bridges TBR array from the buffer layer BUF; and a plurality of first touch electrodes TE1 and a plurality of second touch electrodes on a side of the touch insulating layer TI away from the buffer layer BUF. Electrode blocks of a respective one of the plurality of second touch electrodes are electrically connected by the plurality of touch electrode bridges. Adjacent electrode blocks of the respective one of the plurality of second touch electrodes respectively extend through the touch insulating layer TI to connect to a respective one of the plurality of touch electrode bridges. The first overcoat layer OC1 is on a side of the plurality of first touch electrodes TE1 and the plurality of second touch electrodes away from the touch insulating layer TI.

In some embodiments, the display panel includes a base substrate BS; a plurality of thin film transistors TFT on the base substrate BS; a passivation layer PVX on a side of the plurality of thin film transistors TFT away from the base substrate BS; a first planarization layer PLN1 on side of the passivation layer PVX away from the base substrate BS; a relay electrode RE on side of the first planarization layer PLN1 away ham the passivation layer PVX; a second planarization layer PLN2 on a side of the relay electrode RE away from the first polarization layer PLN1; a pixel definition layer PDL on a side of the second planarization layer PLN2 away from the first planarization layer PLN1 and defining subpixel aperture; an anode AS on a side of the second planarization layer PLN2 away form the first planarization layer PLN1; a light emitting layer EL an a side of the anode AD away from the second planarization layer PLN2; a cathode CD an a side of the light emitting layer EL away from the anode AD; a first inorganic encapsulating layer CVD1 on a side of the cathode CD away from light emitting layer EL; an organic encapsulating layer UP an a side of the first inorganic encapsulating layer CVD1 away from the cathode CD; and a second inorganic encapsulating layer CVD2 on a side of the organic encapsulating layer UP away from the first inorganic encapsulating layer CVS1. Optionally, the display panel is a flexible display panel, and the base substrate BS is a flexible base substrate. Optionally, the buffer layer BUF is on a side of the second inorganic encapsulating layer CVD2 away from the organic encapsulating layer UP, and is in direct contact with the second inorganic encapsulating layer CVD2.

The orthographic projection of the black adhesive layer OAL on the first overcoat layer OC1 not only covers an orthographic projection of the pixel definition layer PDL on the first overcoat layer OC1, but also covers an orthographic projection of the light emitting layer EL an the first overcoat layer OC1. The orthographic projection of the pixel definition layer PDL an the base substrate BS covers the orthographic projection of the black matrix layer BM on the base substrate BS.

Figure 6A:
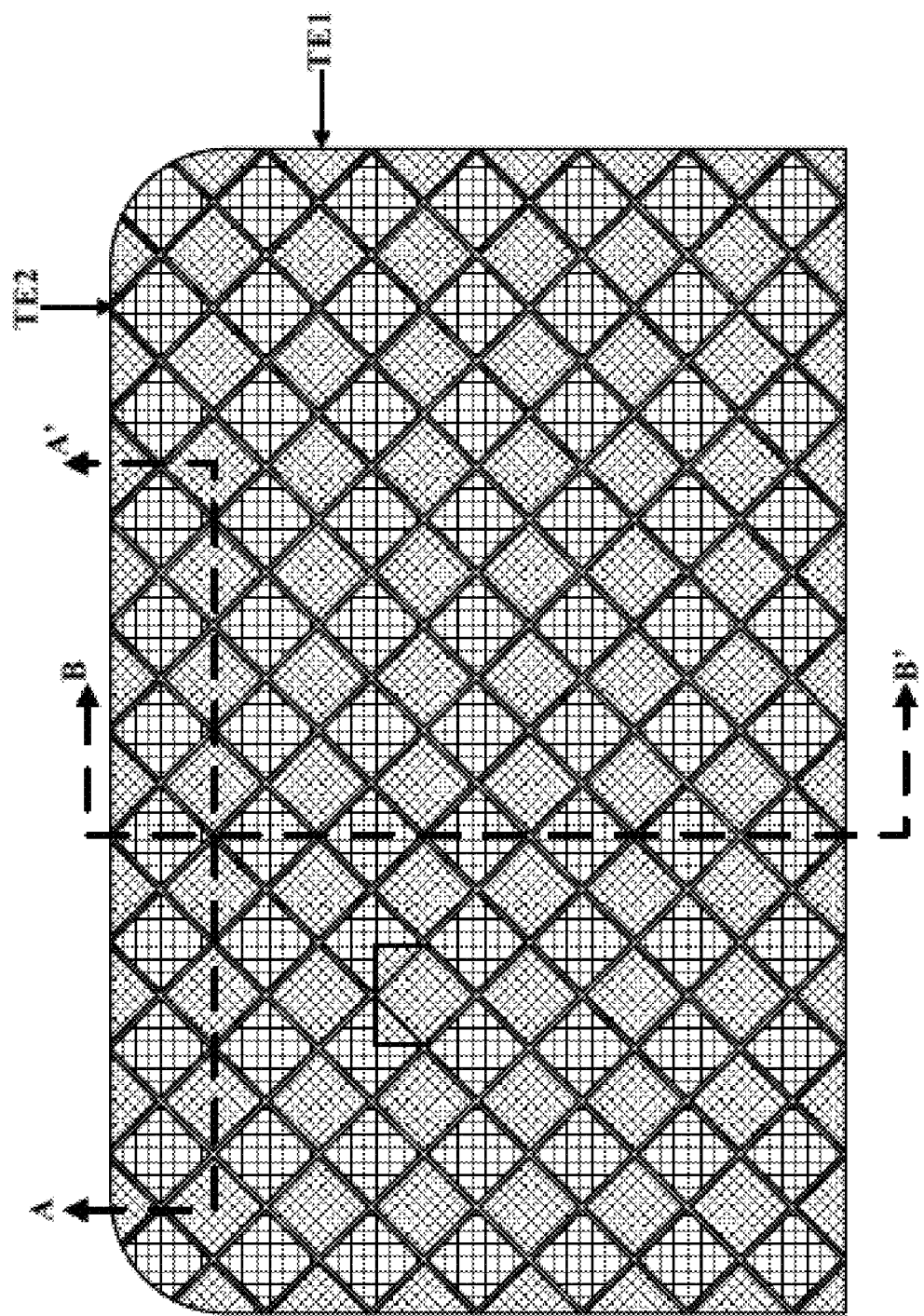
FIG. 6A is a plan view of a display panel in some embodiments according to the present disclosure.

FIG. 6A is a plan view of a display panel in some embodiments according to the present disclosure. FIG. 6B is a cross-sectional view along an A-A' line in FIG. 6A. FIG. 6C is a cross-sectional view along a B-B' line in FIG. 6A. In some embodiments, the display panel includes display elements and thin film transistors. Optionally, the display elements includes a plurality of light emitting diodes, for example, in an organic light emitting diode display panel. Optionally, the display elements include a liquid crystal layer in a plurality of subpixels, for example, in a liquid crystal display panel. Referring to FIGS. 6A to 6C, in some embodiments, the display panel includes a base substrate BS, a plurality of thin film transistors TFT on the base substrate BS, and a plurality of light emitting elements LE an the base substrate BS and respectively connected to the plurality of thin film transistors TFT.

In some embodiments, the display panel further includes an encapsulating layer EN encapsulating the plurality of light emitting elements LE. In some embodiments, the display panel includes a buffer layer BUF and a touch insulating layer TI on the buffer layer BUF. The touch control structure further includes a plurality of touch electrode bridges. The touch insulating layer TI is between the plurality of touch electrode bridges, and the electrode blocks of the plurality of first touch electrodes TE1 and the plurality of second touch electrodes TE2. The plurality of touch electrode bridges respectively extend through vias in the touch insulating layer TI to respectively connect adjacent second electrode blocks in a respective column of the plurality of column of the plurality of second touch electrodes TE2.

Optionally, the plurality of first touch electrodes TE1 and the plurality of second touch electrodes TE2 are in a same layer. As used herein the term "same layer" refers to the relationship between the layers simultaneously formed in the same step. In one example, the plurality of first touch electrodes TE1 and the plurality of second touch electrodes TE2 are in a same layer when they are formed as a result one or more steps of a same patterning process performed in a material deposited in a same deposition process. In another example, the plurality of first touch electrodes TE1 and the plurality of second touch electrodes TE2 can be formed in a same layer by simultaneously performing the step or forming the plurality of first touch electrodes TE1 and the step of forming the plurality of second touch electrodes TE2. The term "same layer" does not always mean that the thickness afire layer or the height of the layer in a cross-sectional view is the same.

Referring to FIG. 2 again, the display panel in some embodiments further includes a color filter CF on the black matrix layer BM and extending into apertures AP defined by the black matrix layer BM. Optionally, an orthographic projection of the color filter CF on the base substrate BS covers an orthographic projection of the light emitting layer EL on the base substrate BS. Optionally, the orthographic projection of the color filter CF on the base substrate BS covers an orthographic projection of the apertures AP defined by the black matrix layer on the base substrate BS. Optionally, the orthographic projection of the black adhesive layer OAL on the first overcoat layer OC1 flatter covers an orthographic projection of the color filter CF on the first overcoat layer OC1. The color filter CF is between the first overcoat layer OC1 and the second overcoat layer OC2. The color filter CF is in direct contact with the first overcoat layer OC1, and in direct contact with the second overcoat layer OC2. The black matrix layer BM is in direct coact with the first overcoat layer OC1, and in direct contact with the second overcoat layer OC2.

Figure 7A:
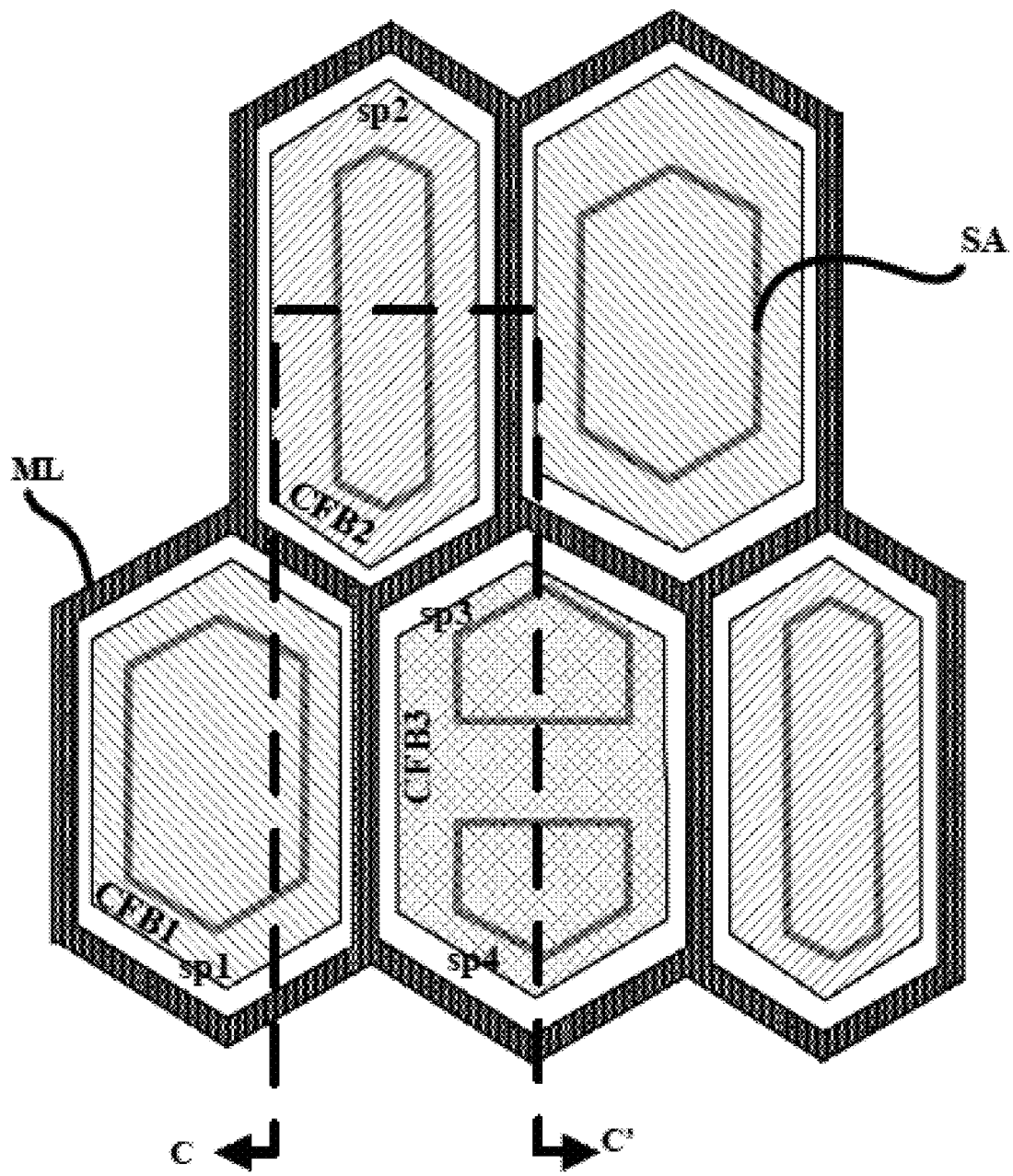
FIG. 7A is a schematic diagram of a plurality of subpixels of a display panel in some embodiments according to the present disclosure.
Figure 7B:
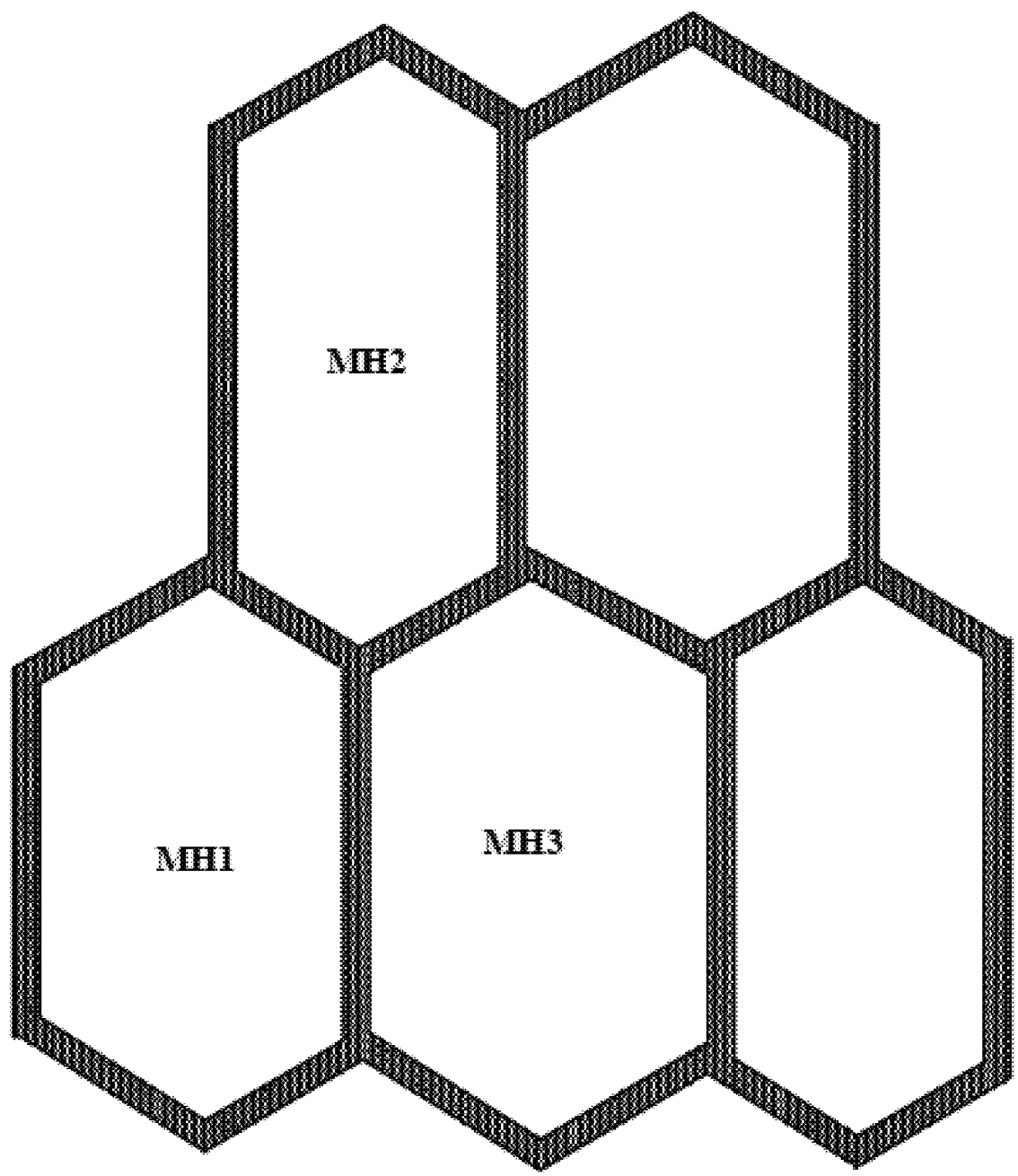
FIG. 7B is a schematic diagram of a plurality of meshes in FIG. 7A.

In some embodiments, the plurality of first touch electrodes and the plurality of second touch electrodes are mesh electrodes comprising mesh lines. FIG. 7A is a schematic diagram of a plurality of subpixels of a display panel in some embodiments according to the present disclosure. FIG. 7B is a schematic diagram of a plurality of meshes in FIG. 7A. FIG. 7C is a cross-sectional view along a C-C' line in FIG. 7A. Referring to FIG. 7A to FIG. 7C, the display panel in some embodiments includes a plurality of subpixels. In same embodiments, the plurality of subpixels includes a first subpixel sp1, a second subpixel sp2, a third subpixel sp3, and a fourth subpixel sp4. The plurality of subpixels in the array substrate are arranged in an array. In one example, the array of the plurality of subpixels includes a S1-S2-S3-S4 format repeating array, in which S1 stands for the first subpixel sp1, S2 stands for the second subpixel sp2, S3 stands for the third subpixel sp3, and S4 stands for the fourth subpixel sp4. In another example, the S1-S2-S3-S4 format is a C1-C2-C3-C3' format, in which C1 stands for the first subpixel sp1 of a first color, C2 stands for the second subpixel sp2 of a second color, C3 stands for the third subpixel sp3 of a third color, and C3' stands for the fourth subpixel sp4 of the third color. In another example, the C1-C2-C3-C3' format is a R-B-G-G format in which the first subpixel spa is a red subpixel, the second subpixel sp2 is a blue subpixel, the third subpixel sp3 is a green subpixel, and the fourth subpixel sp4 is a green subpixel. A plurality of subpixel apertures SA defined by the pixel definition layer PDL are also shown in FIG. 7A.

Referring to FIG. 7A to FIG. 7C, in some embodiments, the plurality of first touch electrodes and the plurality of second touch electrodes are mesh electrodes including mesh lines ML. A respective mesh of the mesh electrodes surrounds at least one subpixel (e.g., 1 or 2 subpixels). An orthographic projection of the black matrix layer BS an the base substrate BS coves an orthographic projection of the mesh lines ML on the base substrate BS. Along a direction from a first one to a second one of two directly adjacent subpixels, a line width of a respective mesh line is 10% to 35% (e.g., 10% to 15%, 15% to 20%, 20% to 25%, 25% to 30%, or 30% to 35%) of a width of a black matrix column or a black matrix row of the black matrix layer BM. Optionally, along the direction from a first one to a second one of two directly adjacent subpixels, the line width of the respective mesh line is 20% of the width of the black matrix column or the black matrix row of the black matrix layer BM. In one example, the line width of a respective mesh line, along the direction from a first one to a second one of two directly adjacent subpixels, is 3 μm. In mother example, the width of the black matrix column or the black matrix row of the black matrix layer BM, along the direction from a first one to a second one of two directly adjacent subpixels, is 14 μm.

In some embodiments, a test respective mesh MH1 of the mesh electrodes surrounds the first subpixel sp1; a second respective mesh MH2 of the mesh electrodes surrounds the second subpixel sp2; a third respective mesh MH3 of the mesh electrodes surrounds both the third subpixel sp3 and the fourth subpixel sp4.

In some embodiments, the color filter CF includes a first color filter block CFB1 of the first color, a second color filter block CFB2 of the second color, and a third color filter block CFB3 of the third color. Optionally, the first respective mesh MH1 of the mash electrodes surrounds a first region having the first color filter block CFB1; the second respective mesh MH2 of the mesh electrodes surrounds a second region having the second color filter block CFB2; and the third respective mesh MH3 of the mesh electrodes surrounds a third region having the third color filter block CFB3.

Figure 8A:
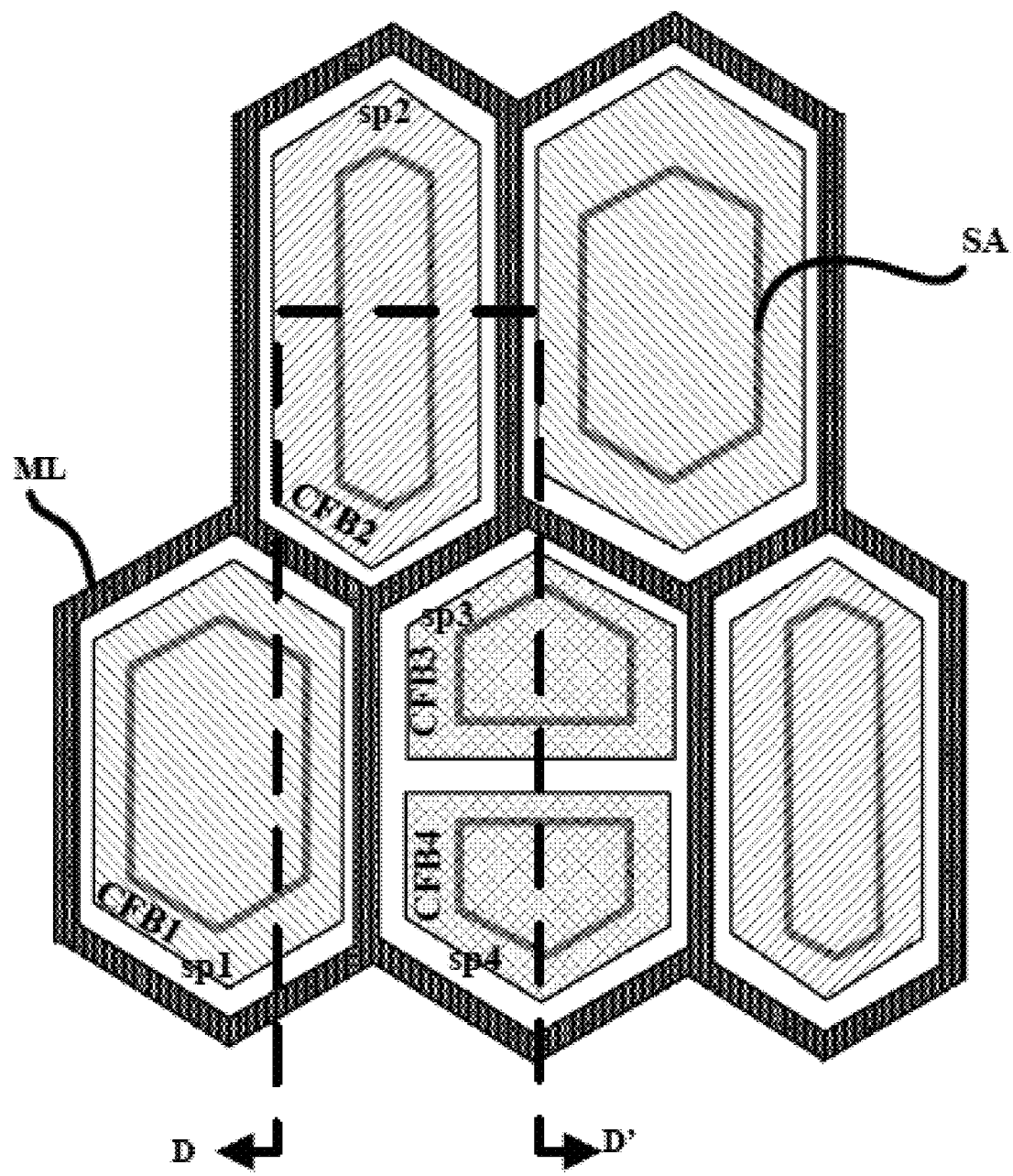
FIG. 8A is a schematic diagram of a plurality of subpixels of a display panel in some embodiments according to the present disclosure.
Figure 8B:
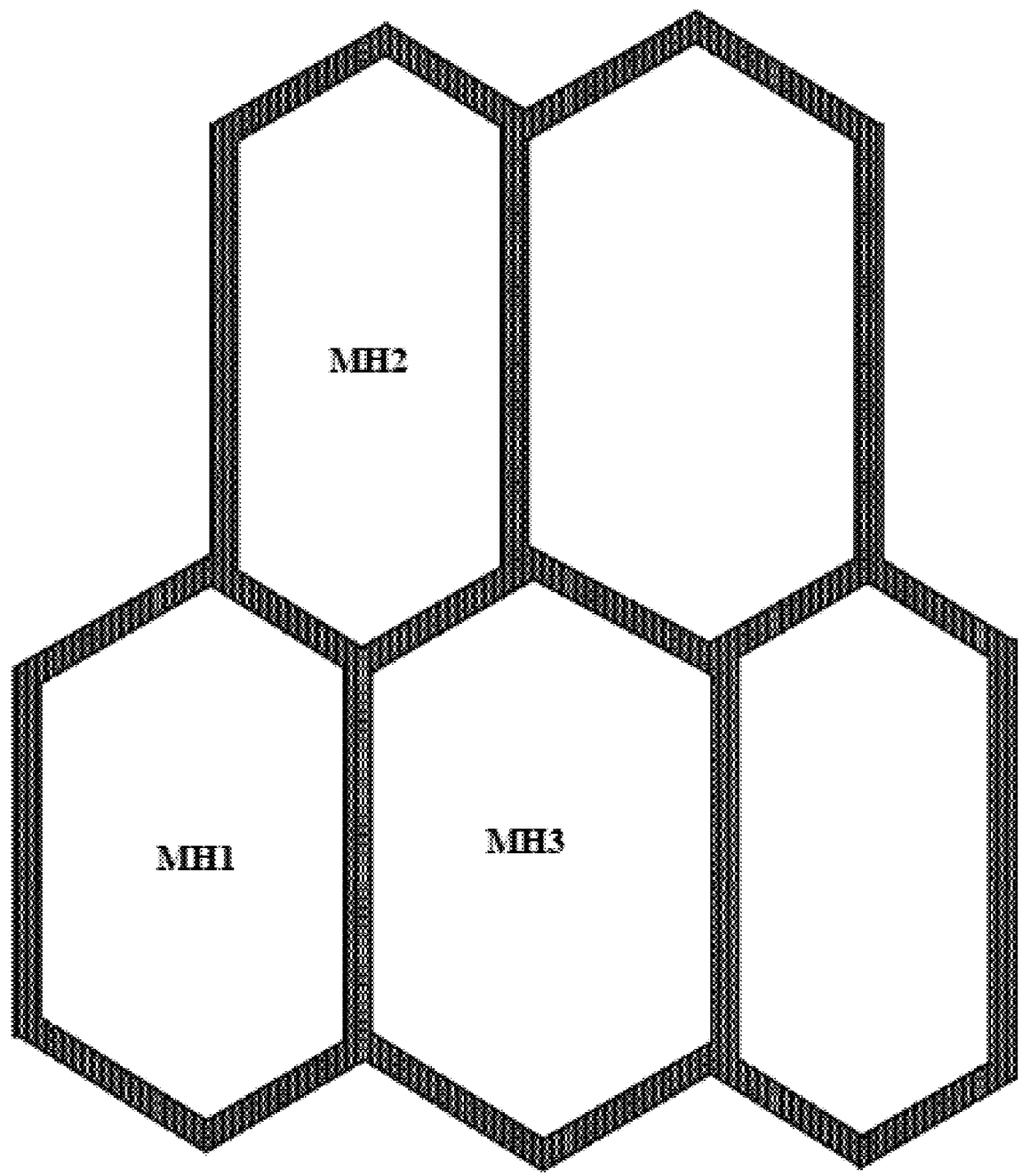
FIG. 8B is a schematic diagram of a plurality of meshes in FIG. 8A.
Figure 8C:
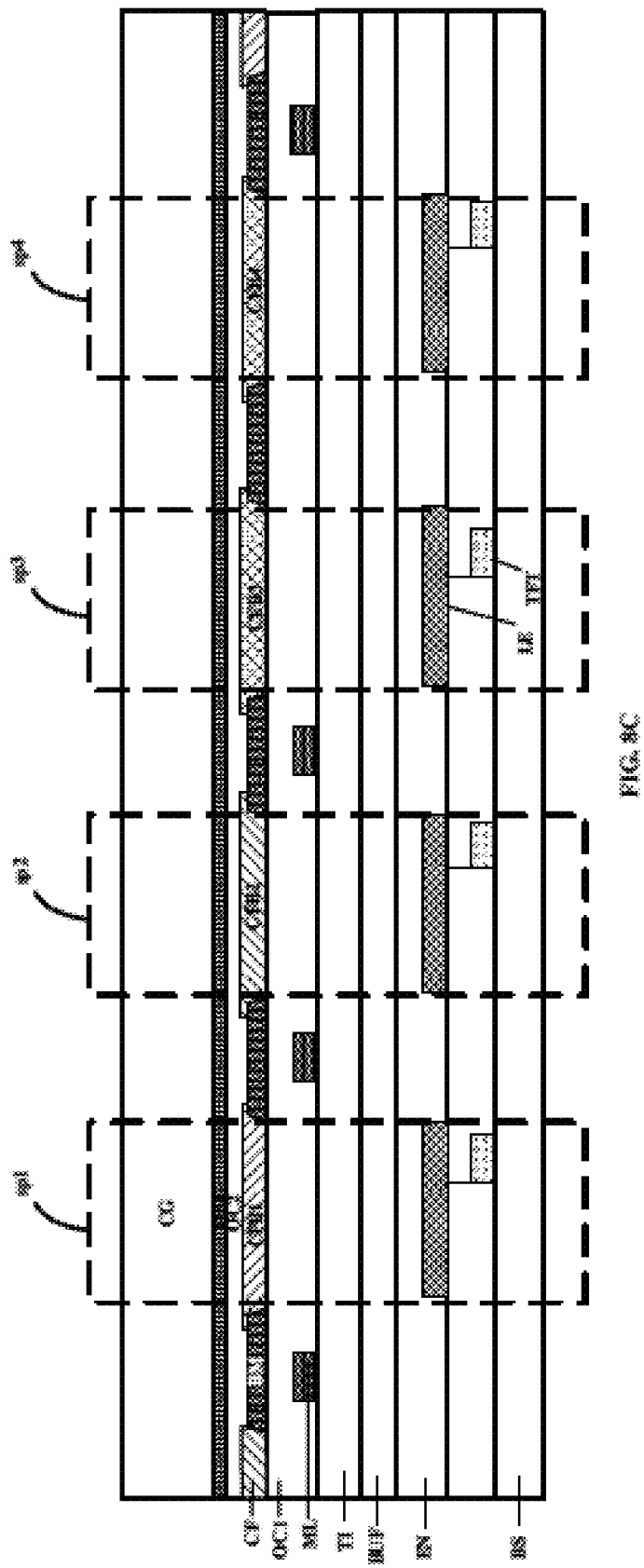
FIG. 8C is a cross-sectional view along a D-D' line in FIG. 8A.

FIG. 8A is a schematic diagram of a plurality of subpixels of a display panel in some embodiments according to the present disclosure. FIG. 8B is a schematic diagram or a plurality of meshes in FIG. 8A. FIG. 8C is a cross-sectional view along a D-D' line in FIG. 8A. Referring to FIG. 8A to FIG. 8C, in some embodiments, the color filter CF includes a first color filter block CFB1 of the first color, a second color filter block CFB2 of the second color, a third color filter block CFB3 of the third color, and a fourth color filter block of the third color CFB4. Optionally, the first respective mesh MH1 of the mesh electrodes surrounds a first region having the first color filter block CFB1; the second respective mesh MH2 of the mesh electrodes surrounds a second region having the second color filer block CFB2; and the third respective mesh MH3 of the mesh electrodes surrounds a third region having both the third color filter block CFB3 and the fourth color filter block CFB4.

Figure 9A:
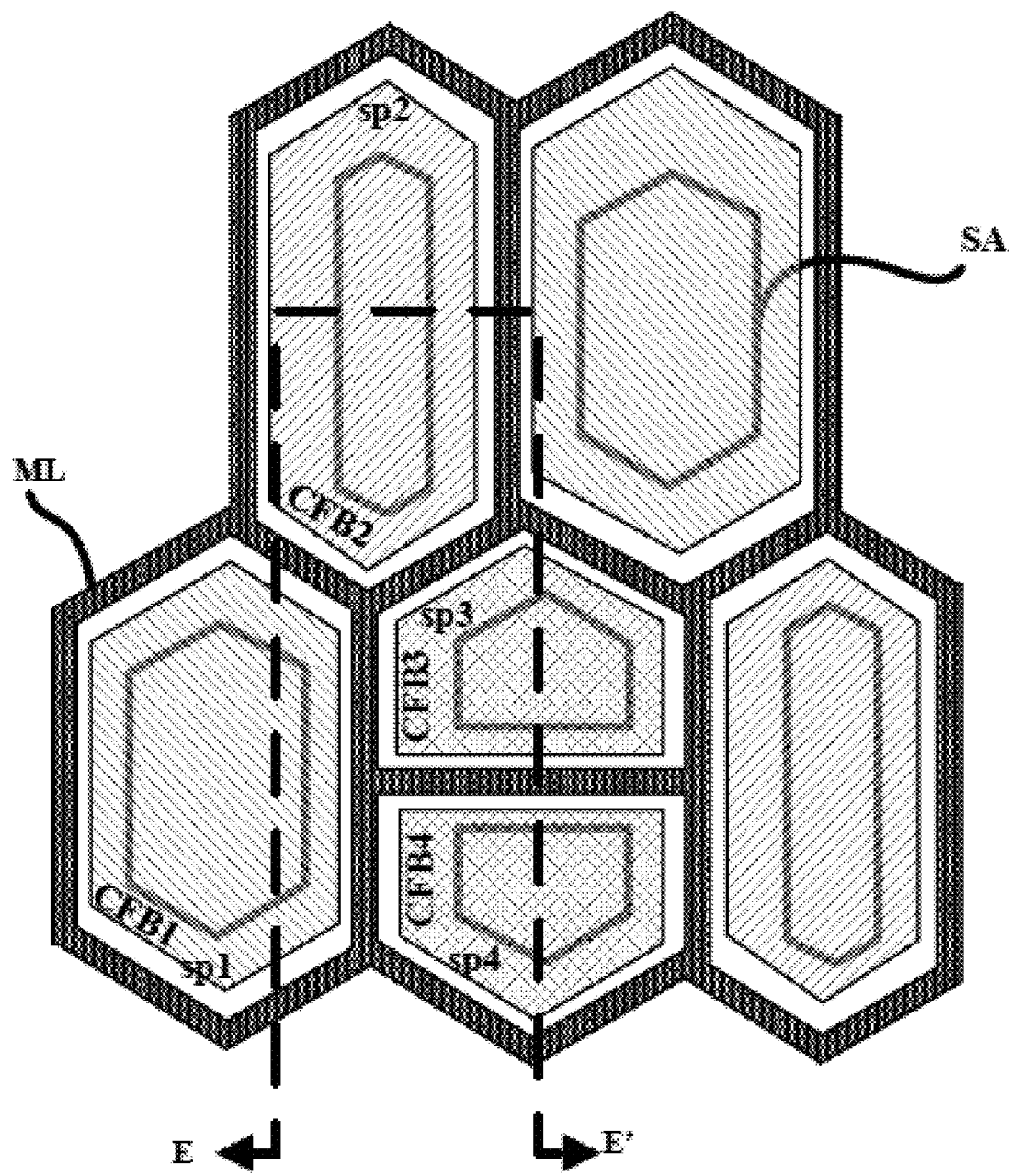
FIG. 9A is a schematic diagram of a plurality of subpixels of a display panel in some embodiments according to the present disclosure.
Figure 9B:
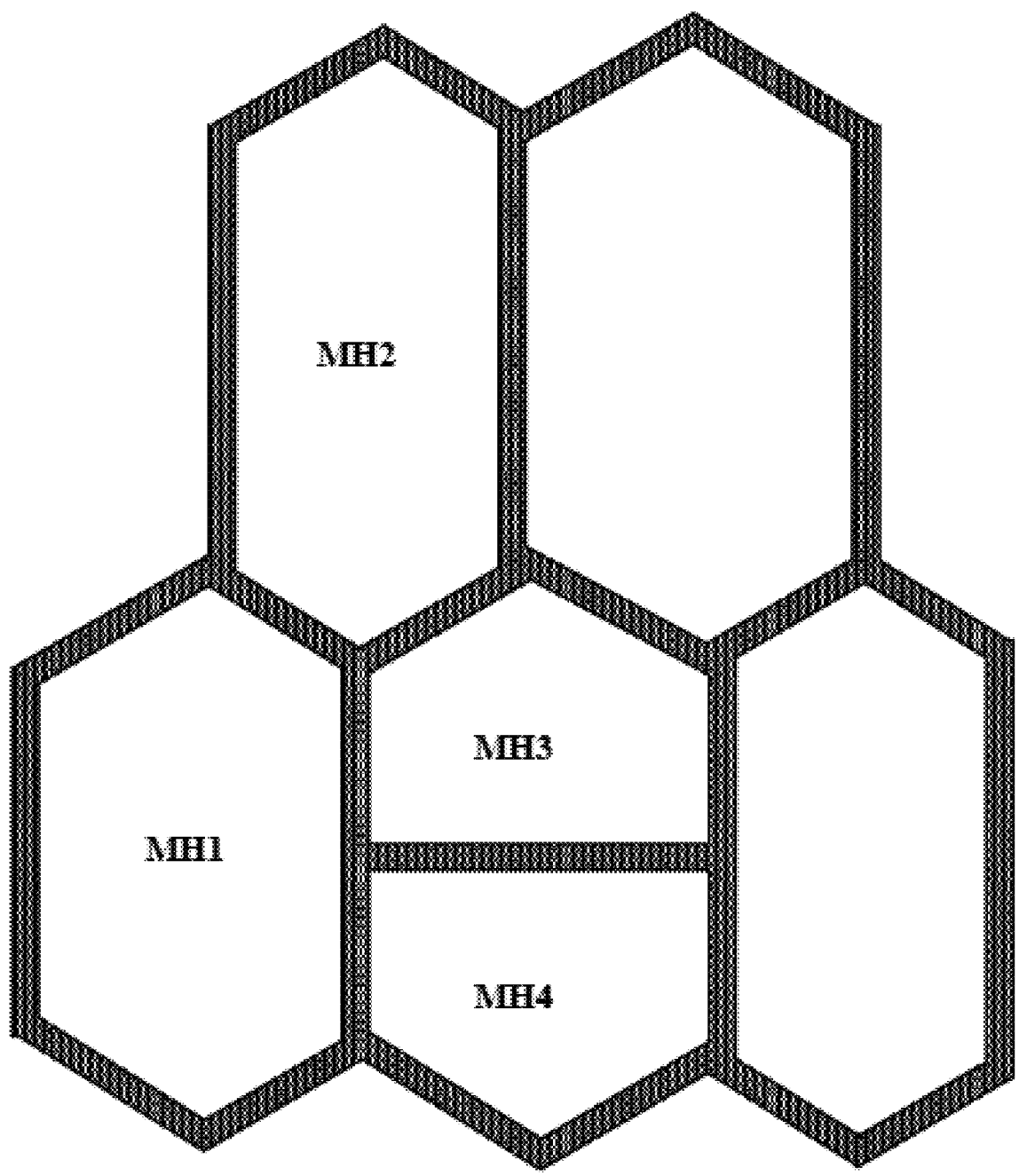
FIG. 9B is a schematic diagram of a plurality of meshes in FIG. 9A.
Figure 9C:
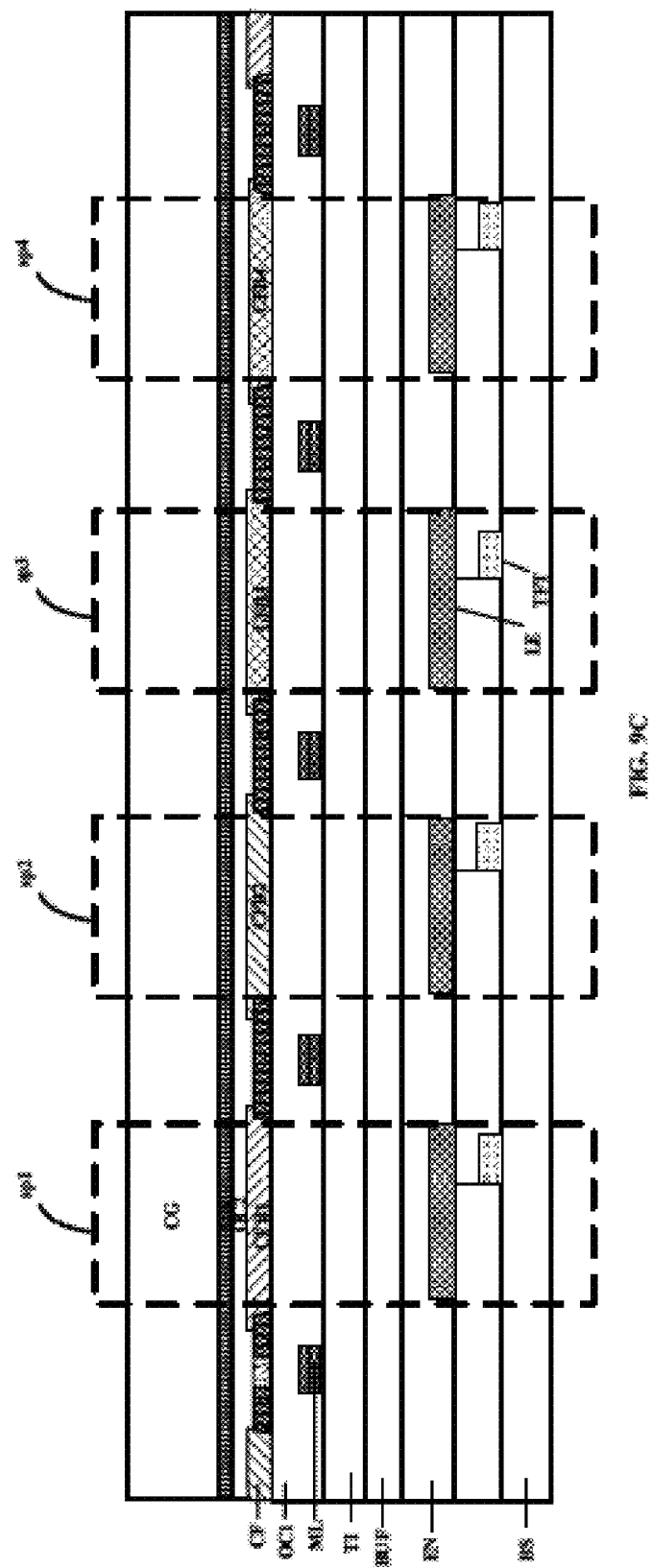
FIG. 9C is a cross-sectional view along a C-C' line in FIG. 9A.

FIG. 9A is a schematic diagram of a plurality of subpixels of a display panel in some embodiments according to the present disclosure. FIG. 9B is a schematic diagram of a plurality of meshes in FIG. 9A. FIG. 9C is a cross-sectional view along an E-E' line in FIG. 9A. Referring to FIG. 9A to FIG. 9C, in some embodiments, a first respective mesh MH1 of the mesh electrodes surrounds the first subpixel sp1; a second respective mesh MH2 of the mesh electrodes surrounds the second subpixel sp2; a third respective mesh MH3 of the mesh electrodes surrounds the third subpixel sp3; and a fourth respective mesh MH4 of the mesh electrodes surrounds the fourth subpixel sp4. Optionally, the first respective mesh MH1 of the mesh electrodes surrounds a first region having the first color filter block CFB1; the second respective mesh MH2 of the mesh electrodes surrounds a second region having the second color filter block CFB2; the third respective mesh MH3 of the mesh electrodes surrounds a third region having the third color filter block CFB3; and the fourth respective mesh MH4 of the mesh electrodes surrounds a fourth region having the fourth color filter block CFB4.

Figure 10:
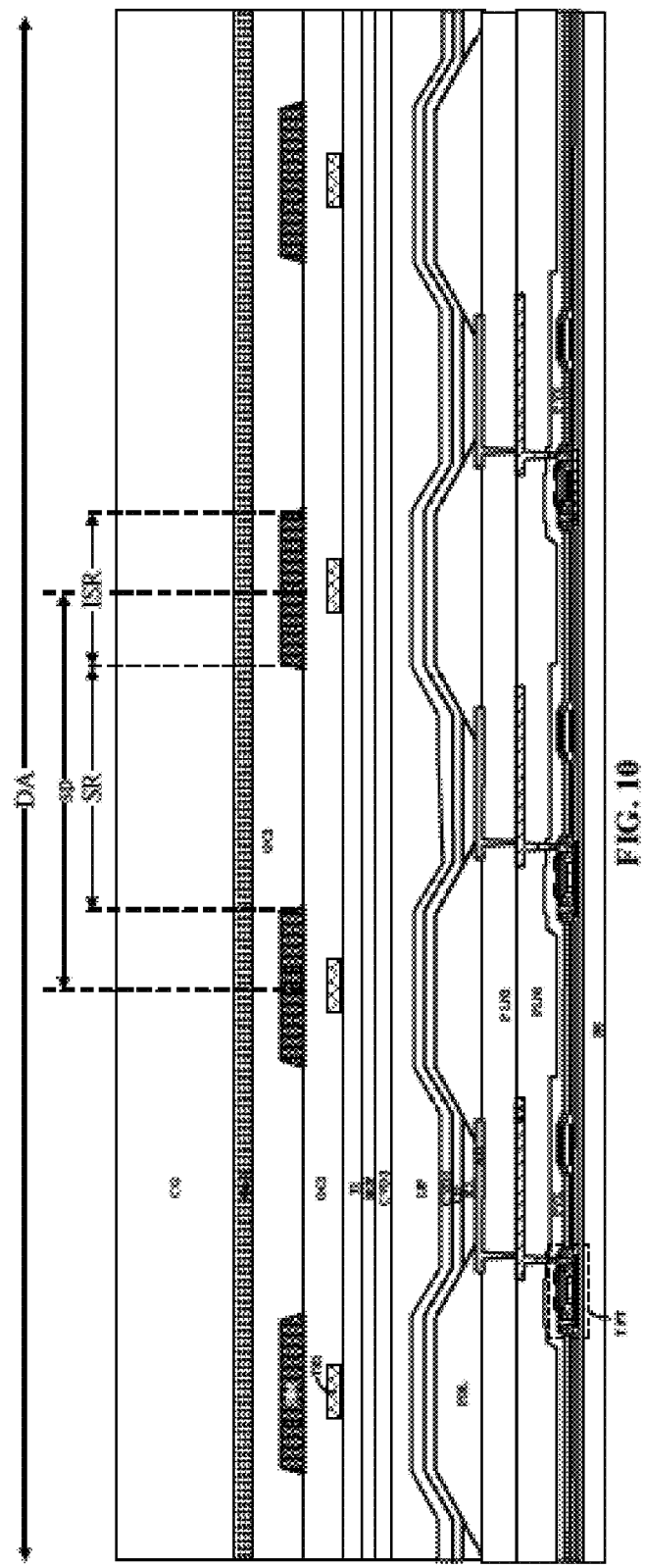
FIG. 10 is a cross-sectional view of a display region in a display panel in some embodiments according to the present disclosure.

In some embodiments, the display panel is absent of any color filter. FIG. 10 is a cross-sectional view of a display region in a display panel in some embodiments according to the present disclosure. Referring to FIG. 10, in the subpixel region SR, the second overcoat layer OC2 is in direct contact with the first overcoat layer OC1. In lieu of a color filter, the second overcoat layer OC2 occupies the space defined by the black matrix layer BM.

In another aspect, the present disclosure provides a display apparatus including a display panel described herein or fabricated by a method described herein, and one or more integrated circuits connected to the display panel. Examples of appropriate display apparatuses include, but are not limited to, an electronic paper, a mobile phone, a tablet computer, a television, a monitor, a notebook computer, a digital album, a GPS, etc. Optionally, the display apparatus is an organic light emitting diode display apparatus. Optionally, the display apparatus is a liquid crystal display apparatus.

In another aspect, the present disclosure provides a method of fabricating a display panel. In some embodiments, the method includes forming a black matrix layer; forming a black adhesive layer on the black matrix layer; and forming a cover on a side of the black adhesive layer away from the black matrix layer. Optionally, the black adhesive layer is formed to extend substantially throughout an entirety of a display region tithe display panel, including a subpixel region and an inter-subpixel region. Optionally, the black adhesive layer comprises an optically clear adhesive and opaque particles distributed throughout the optically clear adhesive. Optionally, light transmittance of the black adhesive layer is in a range of 40% to 80%.

In some embodiments, the method includes forming a first overcoat layer; forming a black matrix layer on the first overcoat layer; forming a second overcoat layer on a side of the black matric layer away from the first overcoat layer; attaching an black adhesive layer on a side of the second overcoat layer away from the black matrix layer; and providing a cover glass on a side of the black adhesive layer away from the second overcoat layer; and adhering the cover glass to the second overcoat layer through the black adhesive layer. Optionally, the black adhesive layer is formed to extend substantially throughout an entirety of a display region of the display panel, including a subpixel region and an inter-subpixel region. Optionally, the black adhesive layer is made of an optically clear adhesive and opaque particles distributed throughout the optically clear adhesive. Optionally, an orthographic projection of the black adhesive layer on the first overcoat layer covers an orthographic projection of the black matrix layer on the first overcoat layer.

In some emhodiments, the method further includes forming a color filter in the subpixel region. The orthographic projection of the black adhesive layer on the first overcoat layer further covers an orthographic projection of the color filter on the first overcoat layer.

In some embodiments, the method is absent of any step of forming a color filter. Subsequent to forming the black matrix layer in the inter-subpixel region, the second overcoat layer is formed so that, in the subpixel region, the second overcoat layer is in direct contact with the first overcoat layer. As compared to a fabrication process for making a display panel with a color filter, the fabrication process for making a display panel absent of a color filter can reduce at least three patterning steps, enhancing the production efficiency and reducing product defects. Moreover, light transmittance in a display panel absent of any color filter can be further improved, e.g., more than 20%, as compared to the display panel with a color filter.

Figure 11A:
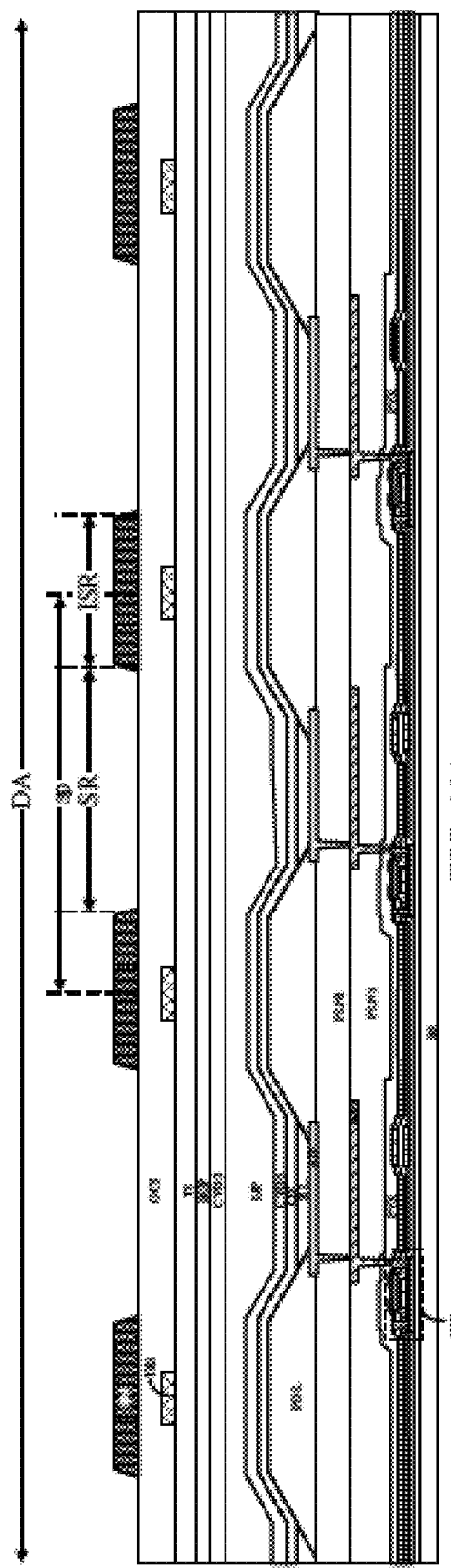
Figure 11B:
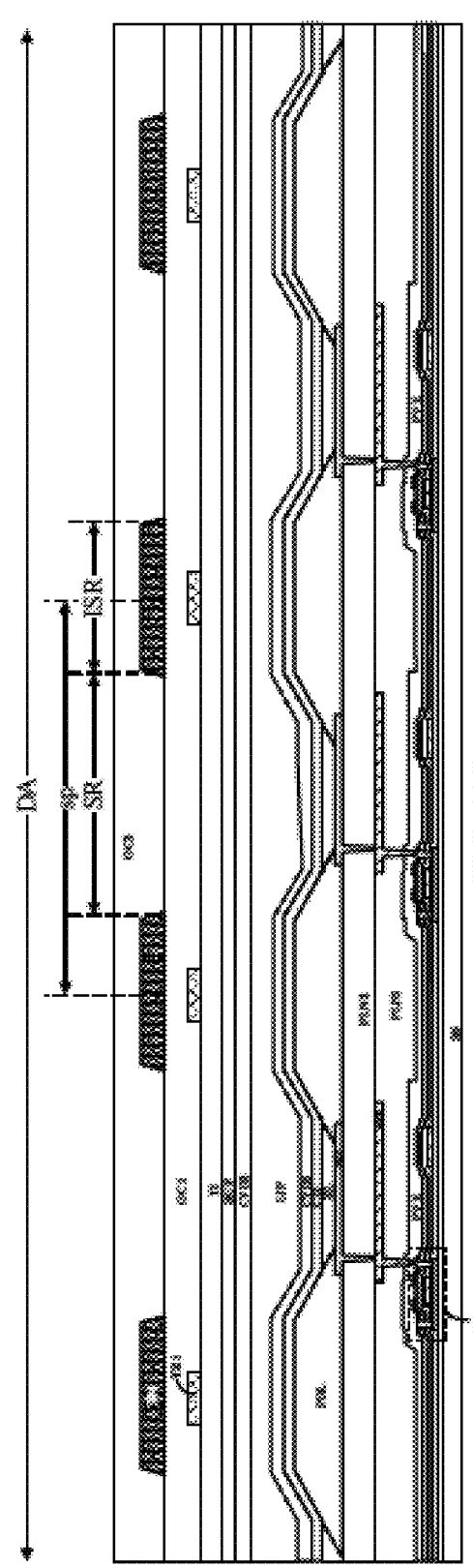

FIGS. 11A to 11C illustrate a method of fabricating a display panel in some embodiments according to the present disclosure. Referring to FIG. 11A, a black matrix layer BM is formed on a side of the first overcoat layer OC1 away from the touch insulating layer TI. The black matrix layer BM is formed in the inter-subpixel region ISR.

Referring to FIG. 11B, subsequent to forming the black matrix layer BM, a second overcoat layer OC2 is formed on a side of the black matrix layer BM and the first overcoat layer OC1 away nom the touch insulating layer TI. The second overcoat layer OC2 is formed so that, in the subpixel region SR, the second overcoat layer OC2 is in direct contact with the first overcoat layer. In the inter-subpixel region ISR, the second overcoat layer OC2 is in direct contact with the black matrix layer BM.

Referring to FIG. 11C, an black adhesive layer OAL is adhered onto an external surface of the second overcoat layer OC2, the black adhesive layer OAL is formed to extend substantially throughout an entirety of a display region DA of the display panel, including the subpixel region SR and the inter-subpixel region ISR.

Referring to FIG. 11D, a cover CG is provided on a side of the black adhesive layer OAL away from the second overcoat layer OC2. The cover CG is adhered to the second overcoat layer OC2 through the black adhesive layer OAL.

Various appropriate black materials and various appropriate fabricating methods may be used to make the black matrix layer BM. For example, a black material may be deposited on a substrate (e.g., by sputtering, vapor deposition, solution coating, or spin coating); and patterned (e.g., by lithography such as a wet etching process) to form the black matrix layer BM. Examples of appropriate black materials for making the black matrix layer BM include, but are not limited to, organic or inorganic black materials such as carbon, a metal or metal oxide (e.g., molybdenum, chromium, or chromium oxide), chromium organic black materials, graphite, a pigment-containing resin. The black matrix layer BM typically has a light transmittance relatively very low, e.g., less than 50%, less than 60%, less than 70%, less than 80%, less than 90%, or less than 95%.

Various appropriate flexible materials may be used for making the base substrate BS and the cover CG. Examples of appropriate materials for making the base substrate BS and the cover CG include glass, silicon, quartz, and flexible materials such as polyimide, polycarbonate, polyethersulfone, polyethylene terephalate, polyethylene naphtalate, polyarylate, and filter-reinforced plastic.

Various appropriate dielectric materials and various appropriate fabricating methods may be used to make the first overcoat layer OC1 and the second overcoat layer OC2. For example, an insulating material may be deposited on the substrate by a plasma-enhanced chemical vapor deposition process. Examples of materials suitable for making the first overcoat layer OC1 and the second overcoat layer OC2 include, but are not limited to, silicon oxide (SiOy), silicon nitride (SiNy, e.g., $Si_3N_4$), silicon oxynitride ($SiO_xN_y$) polyacrylate, polysilane, polyimide, polyvinylidene fluoride, polypropylene, and polytetrafluoroethylene.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended herein and their equivalents in which all terms are meant in their broadest reasonable sense unless otherwise indicated. Therefore, the team "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display panel, comprising a plurality of subpixels; wherein the display panel comprises:
a black matrix layer;
a black adhesive layer on the black matrix layer; and
a cover on a side of the black adhesive layer away from the black matrix layer;
wherein the black adhesive layer extends substantially throughout an entirety of a display region of the display panel, including a subpixel region and an inter-subpixel region;
the black adhesive layer comprises an optically clear adhesive and particles distributed throughout the optically clear adhesive; and
light transmittance of the black adhesive layer is in a range of 40% to 80%.

2. The display panel of claim 1, wherein the light transmittance of the black adhesive layer is in a range of 48% to 71%.

3. The display panel of claim 1, wherein the display panel is absent of any polarizer.

4. The display panel of claim 1, further comprising:
a base substrate;
a plurality of thin film transistors on the base substrate;
a first planarization layer on side of the plurality of thin film transistors away from the base substrate;
an anode on a side of the first planarization layer away from the base substrate;
a pixel definition layer on a side of the anode away from the base substrate, wherein an orthographic projection of the pixel definition layer on the base substrate covers an orthographic projection of the black matrix layer on the base substrate;
a light emitting layer on a side of the anode away from the first planarization layer;
a cathode on a side of the light emitting layer away from the anode;
a first inorganic encapsulating layer on a side of the cathode away from light emitting layer;
an organic encapsulating layer on a side of the first inorganic encapsulating layer away from the cathode; and
a second inorganic encapsulating layer on a side of the organic encapsulating layer away from the first inorganic encapsulating layer.

5. The display panel of claim 4, further comprising:
a passivation layer on a side of the plurality of thin film transistors away from the base substrate;
a relay electrode on side of the first planarization layer away from the passivation layer; and
a second planarization layer on a side of the relay electrode away from the first planarization layer.

6. The display panel of claim 4, further comprising:
a first overcoat layer; and
a second overcoat layer;
wherein the first overcoat layer is on a side of the black matrix layer away from the black adhesive layer;
the second overcoat layer is on a side of the black adhesive layer closer to the black matrix layer; and
the black adhesive layer adheres the cover to the second overcoat layer.

7. The display panel of claim 6, wherein the display panel is absent of any color filter; and
in the subpixel region, the second overcoat layer is in direct contact with the first overcoat layer.

8. The display panel of claim 6, further comprising a color filter on the black matrix layer and extending into apertures defined by the black matrix layer;
> an orthographic projection of the color filter on the base substrate covers an orthographic projection of the light emitting layer on the base substrate; and
> the orthographic projection of the black adhesive layer on the first overcoat layer further covers an orthographic projection of the color filter on the first overcoat layer.

9. The display panel of claim 8, wherein the orthographic projection of the color filter on the base substrate covers an orthographic projection of the apertures defined by the black matrix layer on the base substrate.

10. The display panel of claim 8, wherein the color filter is between the first overcoat layer and the second overcoat layer;
> the color filter is in direct contact with the first overcoat layer, and in direct contact with the second overcoat layer; and
> the black matrix layer is in direct contact with the first overcoat layer, and in direct contact with the second overcoat layer.

11. The display panel of claim 8, further comprising:
a buffer layer;
a plurality of touch electrode bridges on the buffer layer;
a touch insulating layer on a side of the plurality of touch electrode bridges away from the buffer layer; and
a plurality of first touch electrodes and a plurality of second touch electrodes on a side of the touch insulating layer away from the buffer layer, electrode blocks of a respective one of the plurality of second touch electrodes electrically connected by the plurality of touch electrode bridges, adjacent electrode blocks of the respective one of the plurality of second touch electrodes respectively extending through the touch insulating layer to connect to a respective one of the plurality of touch electrode bridges;
wherein the first overcoat layer is on a side of the plurality of first touch electrodes and the plurality of second touch electrodes away from the touch insulating layer.

12. The display panel of claim 11, wherein the plurality of first touch electrodes and the plurality of second touch electrodes are mesh electrodes comprising mesh lines;
> a respective mesh of the mesh electrodes surrounds at least one subpixel; and
> an orthographic projection of the black matrix layer on the base substrate covers an orthographic projection of the mesh lines on the base substrate.

13. The display panel of claim 12, wherein the plurality of subpixels comprises a first subpixel of a first color, a second subpixel of a second color, a third subpixel of a third color, and a fourth subpixel of the third color;
> a first respective mesh of the mesh electrodes surrounds the first subpixel;
> a second respective mesh of the mesh electrodes surrounds the second subpixel; and
> a third respective mesh of the mesh electrodes surrounds both the third subpixel and the fourth subpixel.

14. The display panel of claim 13, wherein the color filter comprises a first color filter block of the first color, a second color filter block of the second color, and a third color filter block of the third color, and a fourth color filter block of the third color;
> the first respective mesh of the mesh electrodes surrounds a first region having the first color filter block;
> the second respective mesh of the mesh electrodes surrounds a second region having the second color filter block; and
> the third respective mesh of the mesh electrodes surrounds a third region having both the third color filter block and the fourth color filter block.

15. The display panel of claim 1, wherein the black adhesive layer has a thickness in a range of 10 μm to 100 μm.

16. The display panel of claim 1, wherein the particles have an average diameter in a range of 10 nm to 500 nm.

17. The display panel of claim 1, wherein the particles comprise a light absorbing black material.

18. The display panel of claim 17, wherein the black material comprises carbon or a black metal oxide material.

19. A display apparatus, comprising the display panel of claim 1, and an integrated circuit connected to the display panel.

20. A method of fabricating a display panel having a plurality of subpixels, comprising:
forming a black matrix layer;
forming a black adhesive layer on the black matrix layer; and
forming a cover on a side of the black adhesive layer away from the black matrix layer;
wherein the black adhesive layer is formed to extend substantially throughout an entirety of a display region of the display panel, including a subpixel region and an inter-subpixel region;
the black adhesive layer comprises an optically clear adhesive and particles distributed throughout the optically clear adhesive; and
light transmittance of the black adhesive layer is in a range of 40% to 80%.

* * * * *